United States Patent
Aipperspach et al.

(10) Patent No.: US 7,206,236 B1
(45) Date of Patent: Apr. 17, 2007

(54) ARRAY REDUNDANCY SUPPORTING MULTIPLE INDEPENDENT REPAIRS

(75) Inventors: Anthony Gus Aipperspach, Rochester, MN (US); Todd Alan Christensen, Rochester, MN (US); Elizabeth Lair Gerhard, Rochester, MN (US); George Francis Paulik, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/330,693

(22) Filed: Jan. 12, 2006

(51) Int. Cl.
*G11C 29/00* (2006.01)

(52) U.S. Cl. .................................. 365/200; 365/230.03
(58) Field of Classification Search ................ 365/200, 365/230.03
See application file for complete search history.

(56) References Cited

U.S. PATENT DOCUMENTS 6,909,647 B2 * 6/2005 Horiguchi et al. .......... 365/200

OTHER PUBLICATIONS

IBM Patent Application POU920040240US1, U.S. Appl. No. 11/053,812, filed Feb. 9, 2005, "Method and Apparatus for Implementing Multiple Column Redundancy for Memory", James W. Dawson, et al.

\* cited by examiner

*Primary Examiner*—Vu A. Le
(74) *Attorney, Agent, or Firm*—Robert R. Williams

(57) ABSTRACT

Arrays such as SRAMs, DRAMs, CAMs & Programmable ROMs having multiple independent failures are repaired using redundant bit lines. A first embodiment provides redundant bit lines on one side of the array. During a write, data is shifted towards the redundant bit lines on the one side of the array, bypassing failed bit lines. A second embodiment provides a spare bit line on each side of the array. During a write, a first failing bit line is replaced by a first spare bit line on a first side of the array, and a second failing bit line is replaced by a second spare bit line on a second side of the array.

17 Claims, 14 Drawing Sheets

WRITE CASE FOR FIRST EMBODIMENT

READ CASE FOR FIRST EMBODIMENT

FIRST IMPLEMENTATION
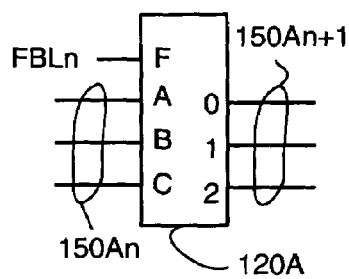
Fig. 5A
| A | B | C | F | 0 | 1 | 2 |
|---|---|---|---|---|---|---|
| 1 | 0 | 0 | 0 | 1 | 0 | 0 |
| 1 | 0 | 0 | 1 | 0 | 1 | 0 |
| 0 | 1 | 0 | 0 | 0 | 1 | 0 |
| 0 | 1 | 0 | 1 | 0 | 0 | 1 |
| 0 | 0 | 1 | 0 | 0 | 0 | 1 |
| 0 | 0 | 1 | 1 | x | x | x |
"x" = "don't care"
Fig. 5B
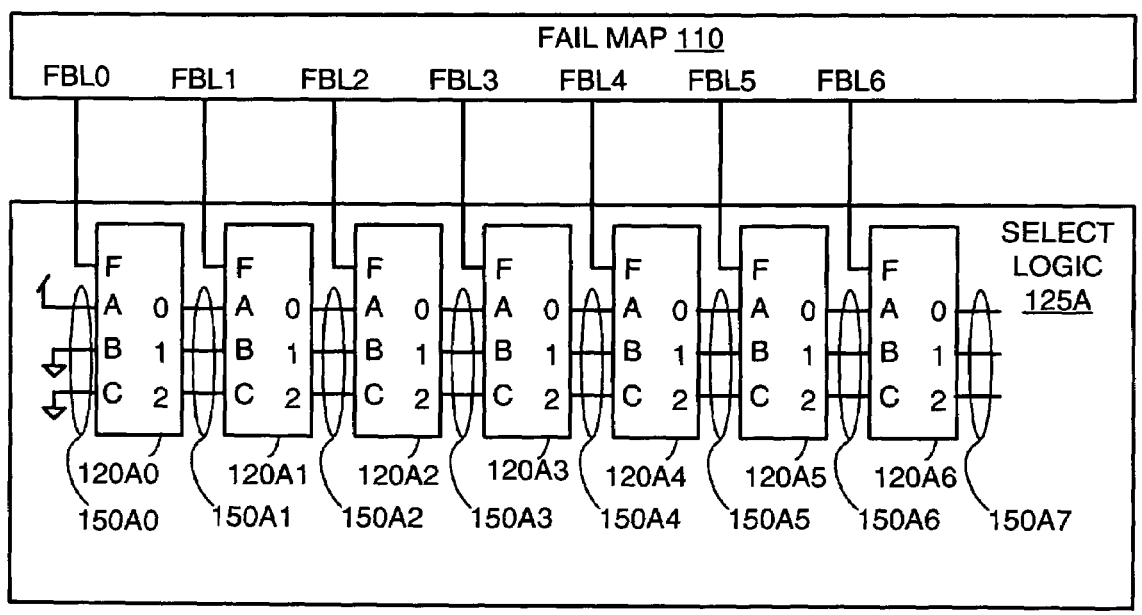
Fig. 5C

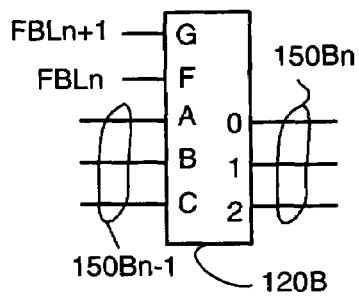
Fig. 6A
FIRST IMPLEMENTATION
| A | B | C | F | G | 0 | 1 | 2 |
|---|---|---|---|---|---|---|---|
| 1 | 0 | 0 | 0 | 0 | 1 | 0 | 0 |
| 1 | 0 | 0 | 0 | 1 | 1 | 0 | 0 |
| 1 | 0 | 0 | 1 | 0 | 0 | 1 | 0 |
| 1 | 0 | 0 | 1 | 1 | 0 | 0 | 1 |
| 0 | 1 | 0 | 0 | 0 | 0 | 1 | 0 |
| 0 | 1 | 0 | 0 | 1 | 0 | 0 | 1 |
| 0 | 1 | 0 | 1 | 0 | 0 | 0 | 1 |
| 0 | 1 | 0 | 1 | 1 | x | x | x |
| 0 | 0 | 1 | 0 | 0 | 0 | 0 | 1 |
| 0 | 0 | 1 | 0 | 1 | x | x | x |
| 0 | 0 | 1 | 1 | 0 | x | x | x |
| 0 | 0 | 1 | 1 | 1 | x | x | x |
"x" = "don't care"
Fig. 6B
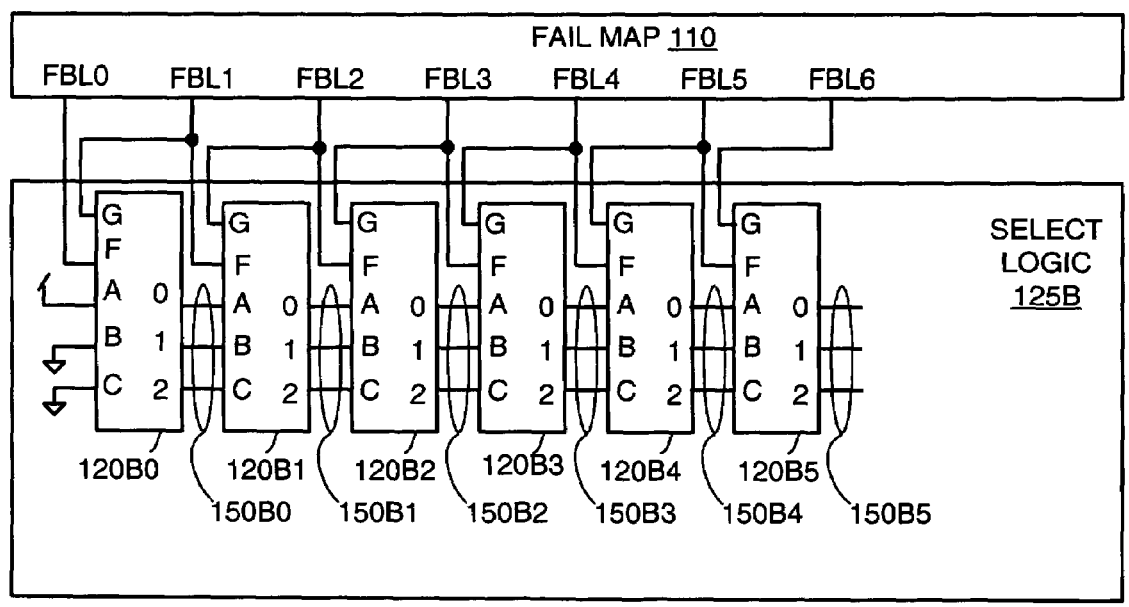
Fig. 6C

FIRST IMPLEMENTATION

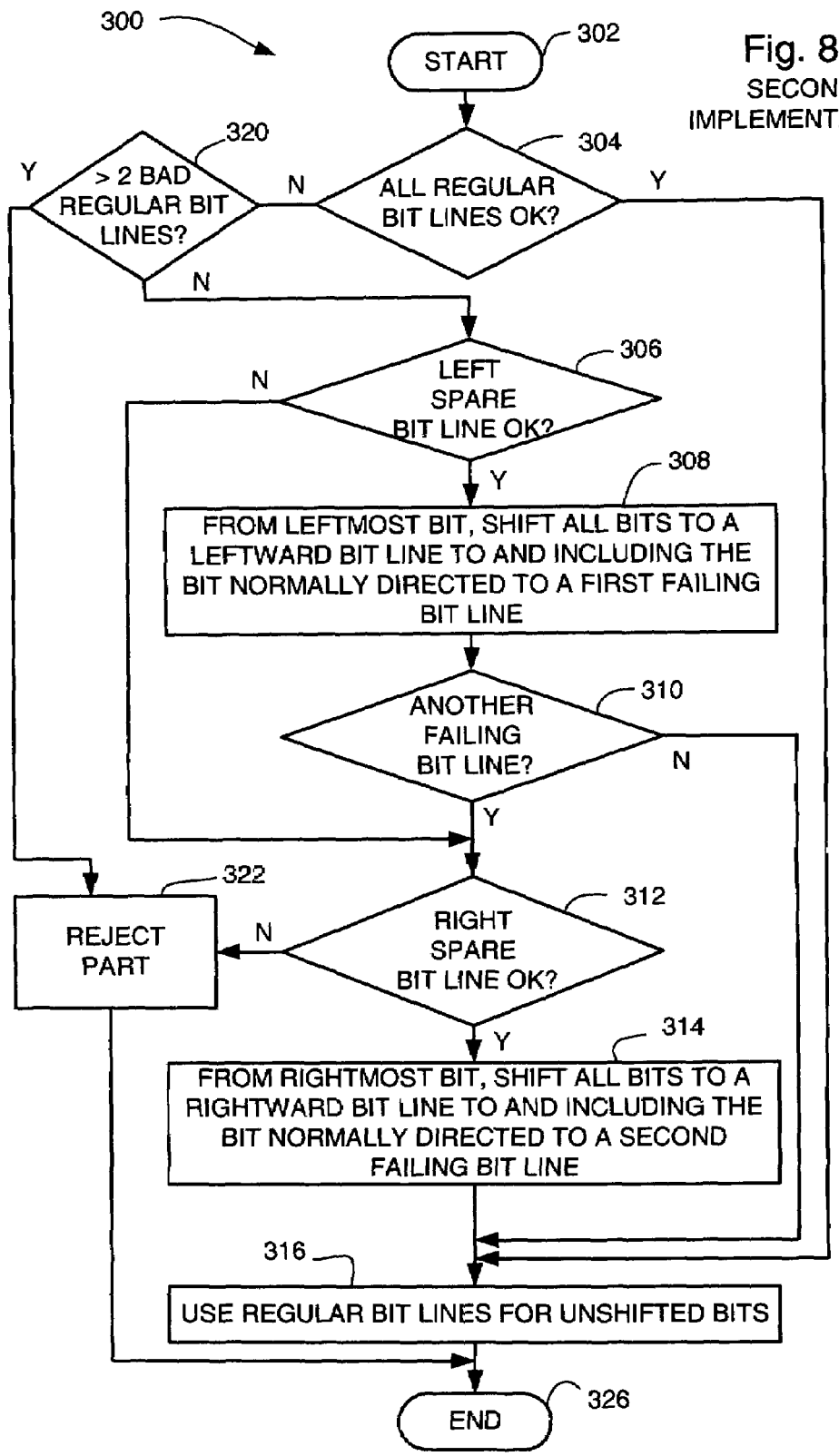

Fig. 10
SECOND IMPLEMENTATION
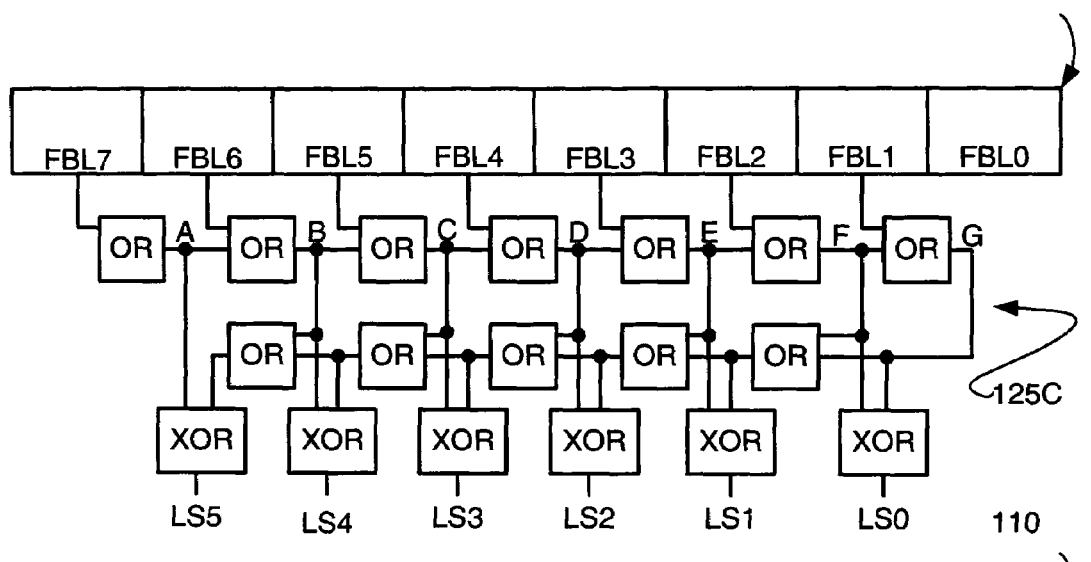
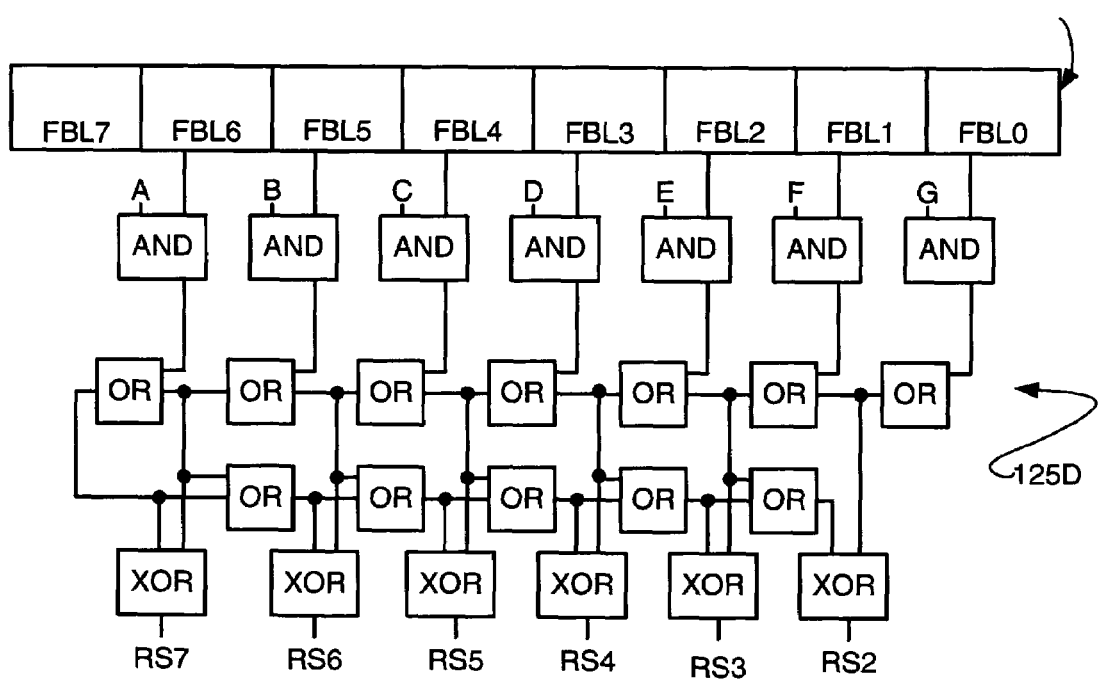

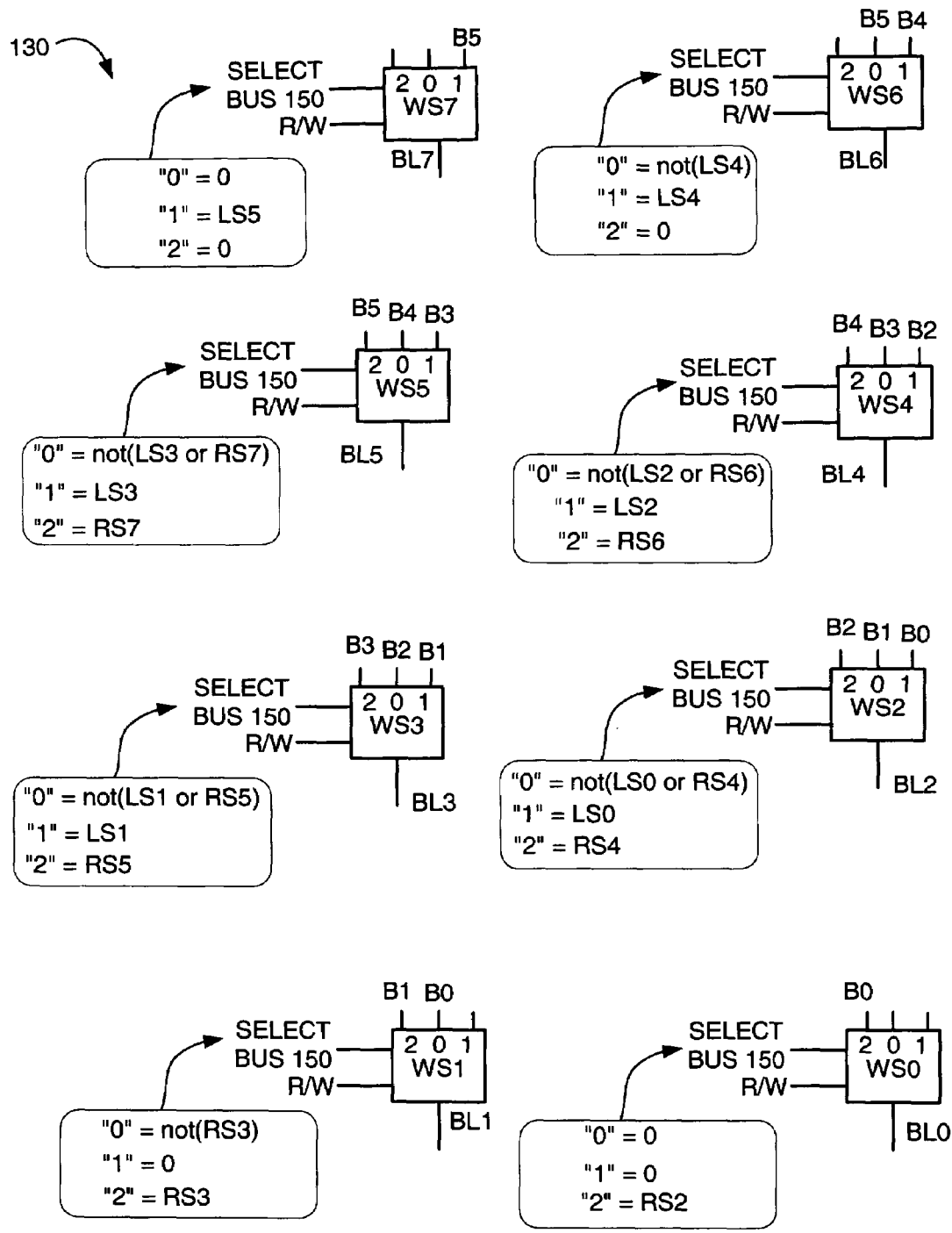
Fig. 11A  SECOND IMPLEMENTATION

SECOND IMPLEMENTATION

ARRAY REDUNDANCY SUPPORTING MULTIPLE INDEPENDENT REPAIRS

BACKGROUND OF THE INVENTION

1. Field of the Invention

This invention relates generally to arrays. More specifically this invention relates to use of spare bit lines in the arrays.

2. Description of the Related Art

Electronic systems such as computer processors, personal digital assistants (PDAs), and electronic gaming systems, include large amounts of arrays to store information. Arrays dominate, in terms of area used on chip, many modern implementations of such electronic systems. A very large percentage of modern processor chip area, for example, is occupied by a first level cache, a second level, and even third level cache. Such caches are typically implemented as SRAM (Static Random Access Memory) arrays, although some processor chips are implementing one or more of the cache arrays with DRAM (Dynamic Random Access memory) arrays. In addition, electronic systems often use CAM (Content Addressable Memory) arrays, ROM (Read Only Memory) arrays, and the like. Of course, main memory used in computer systems is typically implemented a number of memory chips manufactured in DRAM technology.

During manufacture of a semiconductor chip, defects can occur that cause parts of the chip to be nonfunctional. In the case of an array, a bit line may be nonfunctional as a result of a manufacturing defect. The nonfunctional bit line may be discontinuous along a length of the bit line. The nonfunctional bit line may be shorted to a voltage supply such as VDD or ground. The nonfunctional bit line may be shorted to an adjacent bit line.

Arrays frequently have one failing bit line, and a spare bit line is used to replace the failing bit line, with data signals being routed around the failing bit line to the spare bit line during writes to the array and data being routed from the spare bit line to the proper data signals during reads.

As more bits are stored in arrays on modern semiconductor chips, resultant from an ever-increasing demand for more storage close to processing elements, the probability of multiple independent failing bit lines increases. An unrepairable array means that an expensive semiconductor chip must be discarded.

Therefore, there is a need for a method and apparatus to repair multiple independent bit line failures in an array.

SUMMARY OF THE INVENTION

The present invention provides a method and apparatus to repair multiple independent bit line failures in an array. A test unit tests the array and creates a fail map that stores information identifying failed bit lines. A select logic uses the fail map to route data on data signals to valid (nonfailing) spare bit lines.

In a first embodiment, two or more spare bit lines are located on a first side of the array. If no bit lines in a set of non-spare bit lines are failing bit lines, none of the two or more spare bit lines are used. If one bit line in the set of non-spare bit lines is a failing bit line, one of the two or more spare bit lines are used. If two bit lines in the set of non-spare bit lines are failing, two of the two or more spare bit lines are used. If there is more failing bit lines in the set of non-spare bit lines than there are spare bit lines, the array can not be repaired.

In a second embodiment, one or more spare bit lines are located on each side of the array. The one or more spare bit lines on a first side are used to replace failing bit lines in the set of non-spare bit lines; then the one or more spare bit lines on a second side of the array are used to replace additional failing bit lines in the set of non-spare bit lines. As with the first embodiment, if there is more failing bit lines in the set of non-spare bit lines than there are spare bit lines, the array can not be repaired.

BRIEF DESCRIPTION OF THE DRAWINGS

FIG. 5A shows a block diagram of a logic block suitable to combine a value in the fail map with a history of previous bit line failures useful to control write selectors of the first embodiment.

FIG. 5B shows a truth table implemented by the logic block of FIG. 5A.

FIG. 5C shows the fail map coupled to a number of logic blocks of FIG. 5A, providing write select logic for the first embodiment of the invention.

FIG. 6A shows a block diagram of a logic block suitable to combine a value in the fail map with history of previous bit line failures useful to control read selectors of the first embodiment.

FIG. 6B shows a truth table implemented by the logic block of FIG. 6A.

FIG. 6C shows the fail map coupled to a number of logic blocks of FIG. 6A providing read select logic for the first embodiment of the invention.

FIG. 8 shows a flow chart of a second embodiment of the invention, the second embodiment having a spare bit line on each side of the array.

FIG. 10 shows logic in a redundancy selector suitable for routing data signals to bit lines and bit lines to data signals in the second embodiment.

FIG. 11A shows details of selection controls applied to each write selector in the redundancy selector used in the second embodiment.

DETAILED DESCRIPTION OF THE PREFERRED EMBODIMENTS

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The present invention provides methods and apparatus to repair multiple independent bit line failures in an array in a storage. The storage can be, for examples meant to explain but not to limit, a Static Random Access Memory (SRAM), a Dynamic Random Access Memory (DRAM), a ROM (Read Only Memory), or a Content Addressable Memory (CAM). The array is designed with more than one spare bit line. In a first embodiment of the invention, all spare bit lines are physically placed on one side of the array. In a second embodiment of the invention, one or more spare bit lines are placed on a first side of the array, and one or more spare bit lines are placed on a second side of the array. It will be understood that while a single array 160 is shown for exemplary purposes in the storage (e.g., DRAM, SRAM, etc), many storage implementation include a number of arrays, and the present invention is applicable to each array in such a multi-array storage.

Figure 1:
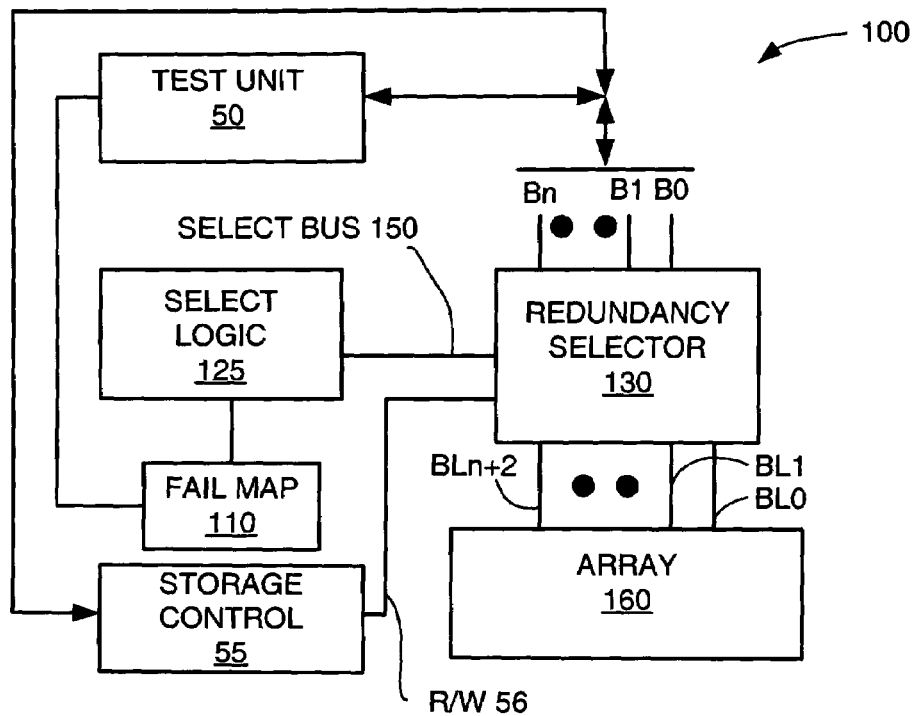
FIG. 1 is a block diagram of an array system.

FIG. 1 shows array system 100 in block diagram format. Array system 100 further comprises array 160 in which data is stored. Array 160 has a number of bit lines, shown as bit lines BL0–BLn+2 that support a number of data signals, shown as data signals B0–Bn. In other words, the exemplary array has two more bit lines than data signals, having, and therefore two spare bit lines. During writes, redundancy selector 130 routes data signals B0–Bn to bit lines BL0–BLn+2, responsive to information provided by select logic 125 and received by redundancy selector 130 via a select bus 150. During reads, redundancy selector 130 routes data to data signals B0–Bn from non-failing bit lines which were written to from data signals B0–Bn during writes.

During a test period, a test unit 50 determines how many failing bit lines, if any, exist in array 160, and identifies which bit lines are failing. For example, in an embodiment, an ABIST (Array Built in Self Test) system is an implementation of test unit 50, which determines how many failing bit lines, if any, exist in array 160 and identifies which bit lines are failing. In an alternative embodiment, an off-chip tester determines how many failing bit lines, if any, exist in array 160, and identifies which bit lines are failing. If there are more failing bit lines than can be repaired by using spare bit lines, the part is discarded. Test unit 50 stores the identity of failing bit lines in fail map 110. Fail map 110, in an embodiment, is implemented in a nonvolatile storage. For example, fail map 110 in embodiments is implemented with eFuses (electrically programmable fuses), laser blown fuses, or stored off-chip on a hard disk, CDROM, DVD, or the like. Fail map 110, in an alternative embodiment, is implemented in volatile storage, such as a register utilizing latches, or an SRAM (Static Random Access Memory). If fail map 110 is implemented in volatile storage, test unit 50 must be used during a test period when array system 100 is powered up, with test unit 50 identifying which bit lines are failing, and writing the identity of failing bit lines into fail map 110.

Fail map 110 is coupled to select logic 125, which uses information stored in fail map 110 regarding which bit lines are failing, and controls selectors in redundancy selector 130, via select bus 150, to route data signals to nonfailing bit lines during writes, and to route bit lines to correct data signals during reads. A storage control 55 sends data signals B0–Bn to redundancy selector 130 and word lines (not shown) to array 160. Storage control 55 controls the logical value of R/W 56. For example, R/W 56 has a logical value of "1" for a read, and "0" for a write.

DESCRIPTION OF FIRST EMBODIMENT OF THE INVENTION

Figure 2A:
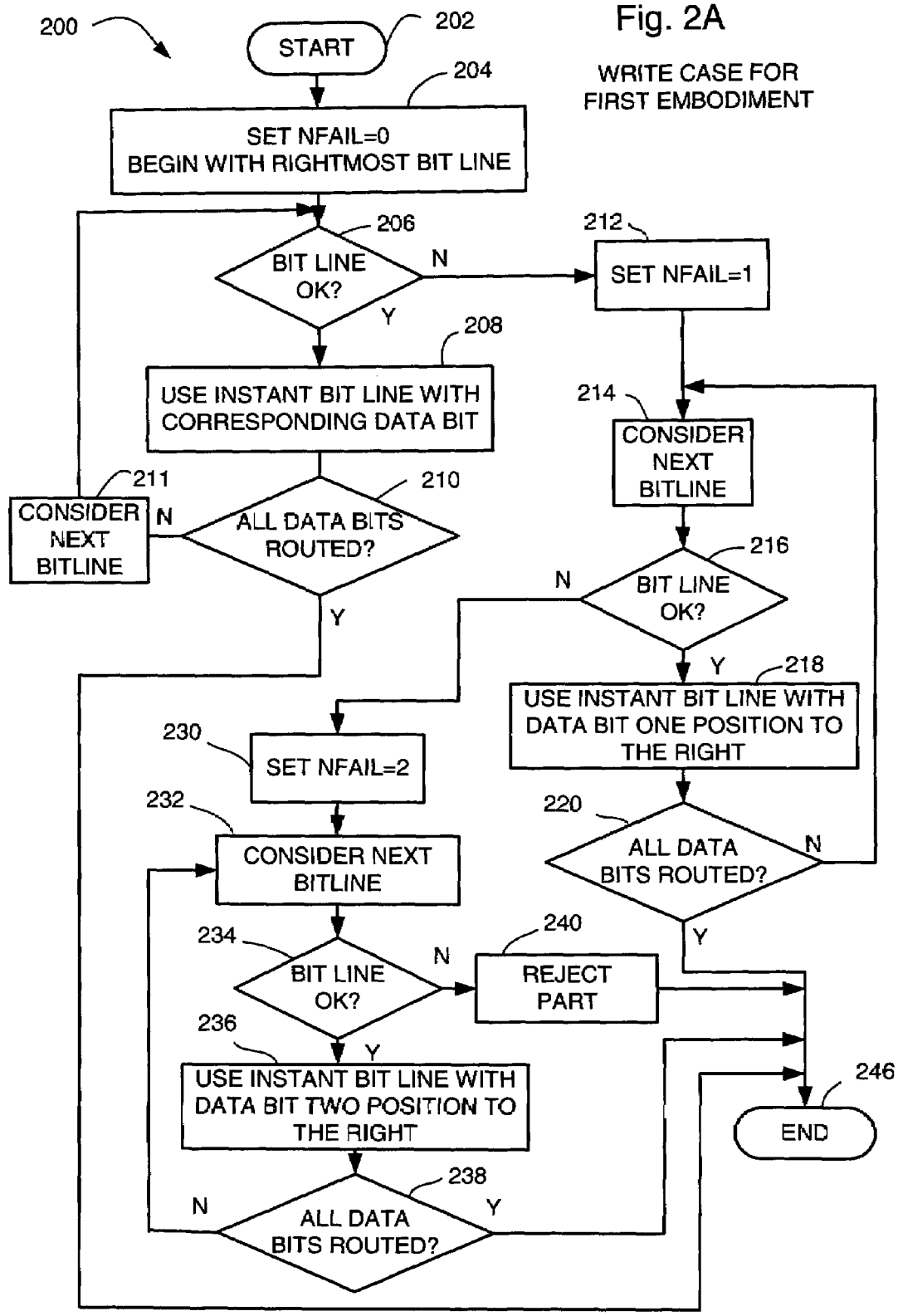
FIG. 2A is a flow chart of a data signal to write bit line selection for a first embodiment of the invention, the first embodiment having spare bit lines on only one side of the array.

FIG. 2A shows a flow chart that teaches a method 200 for routing of data signals to nonfailing bit lines during writes in a first embodiment of the invention wherein all spare bit lines are on one side of the array. Method 200 describes an embodiment of the invention having two spare bit lines at the left of array 160. It will be understood that similar steps will accommodate two spare bit lines at the right of array 160.

Referring back to FIG. 1, if there are no failing bit lines, data signal B0 is routed to bit line BL0; B1 to BL1, and so on to data signal Bn being routed to BLn. If a single bit line in a set of non-spare bit lines consisting of bit lines BL0–BLn is failing, a first spare bit line BLn+1 is used. If two bit lines in the set of non-spare bit lines are failing, both spare bit lines BLn+1 and BLn+2 are used.

Method 200 begins with a right-most bit line and proceeds by subsequent bit lines to the left, controlling selection of routing of data signals to bypass failing bit lines, and using one or both of the two spare bit lines at the left of array 160 as needed to repair one or two failing bit lines in array 160 (FIG. 1).

Method 200 starts at step 202. In step 204, no failing bit lines have yet been encountered (NFAIL=0), and the right-most bit line is selected as an instant bit line. In step 206, the instant bit line is checked for failure. If the bit line is functional (that is, non-failing), control passes to step 208, which routes to the instant bit line the corresponding data signal. For example, data signal B0 is routed to bit line BL0. In step 210, a check is made to see if all data signals have been routed to bit lines. If so, control passes to step 246, the end of method 200. If additional data bits need routing to bit lines, step 210 passes control to step 211, in which the next bit line to the left is considered as the instant bit line. Step 211 passes control back to step 206. If there are no failing bit lines in the non-spare set of bit lines (BL0–BLn), all data signals B0–Bn are routed to functional bit lines BL0–BLn by the loop comprising steps 206, 208, 210, and 211.

If step 206 determines that an instant bit line is failing, control passes to step 212. Step 212 sets NFAIL=1 (i.e., one fail has been encountered so far). Control passes to step 214, which considers the next bit line (still proceeding through bit lines right to left in array 160). In step 216, if the instant bit line is functional, control passes to step 218, which routes to the instant bit line a data signal one position to the right. For example, with NFAIL=1, bit line BL3 would receive data from data signal B2. Step 220 checks whether all data bits have been routed. If so, control passes to step 246 which ends method 200. If all data bits have not been routed, step 220 passes control to step 214. If no further failing bit lines are encountered, that is, only one failing bit line has been encountered, the loop comprising steps 214, 216, 218, and 220 route the remaining data signals to bit lines one to the left of their corresponding bit line, wherein a corresponding bit line has the same numerical suffix as the data signal (e.g., data signal B3 corresponds to bit line BL3). In other words, bit lines BLx, following a single failed bit line, receives data signal Bx−1, where "x" denotes the instant bit line.

If step 216 determines that an instant bit line is failing, the instant bit line is a second failing bit line. Control passes to step 230 which sets NFAIL=2 (i.e., two failing bit lines have been encountered). In step 232, the next bit line (still going right to left) is made the instant bit line. In step 234, if the instant bit line is a failing bit line, the part is rejected in step 240 and the method is ended by step 246. It will be understood, that step 234 is optional if, during testing of array system 100, a semiconductor chip including the array system 100 has already been rejected or discarded. If step 234 determines that the instant bit line is functional, step 236 uses the instant bit line with a data signal two positions to the right. For example, bit line BL5 would receive data from data signal B3 if bit lines BL4 and BL3 were failing. In step 238 a check is made to see if all data signals have been routed to bit lines. If not, control passes to step 232. If so, control passes to step 246 which ends method 200.

Figure 2B:
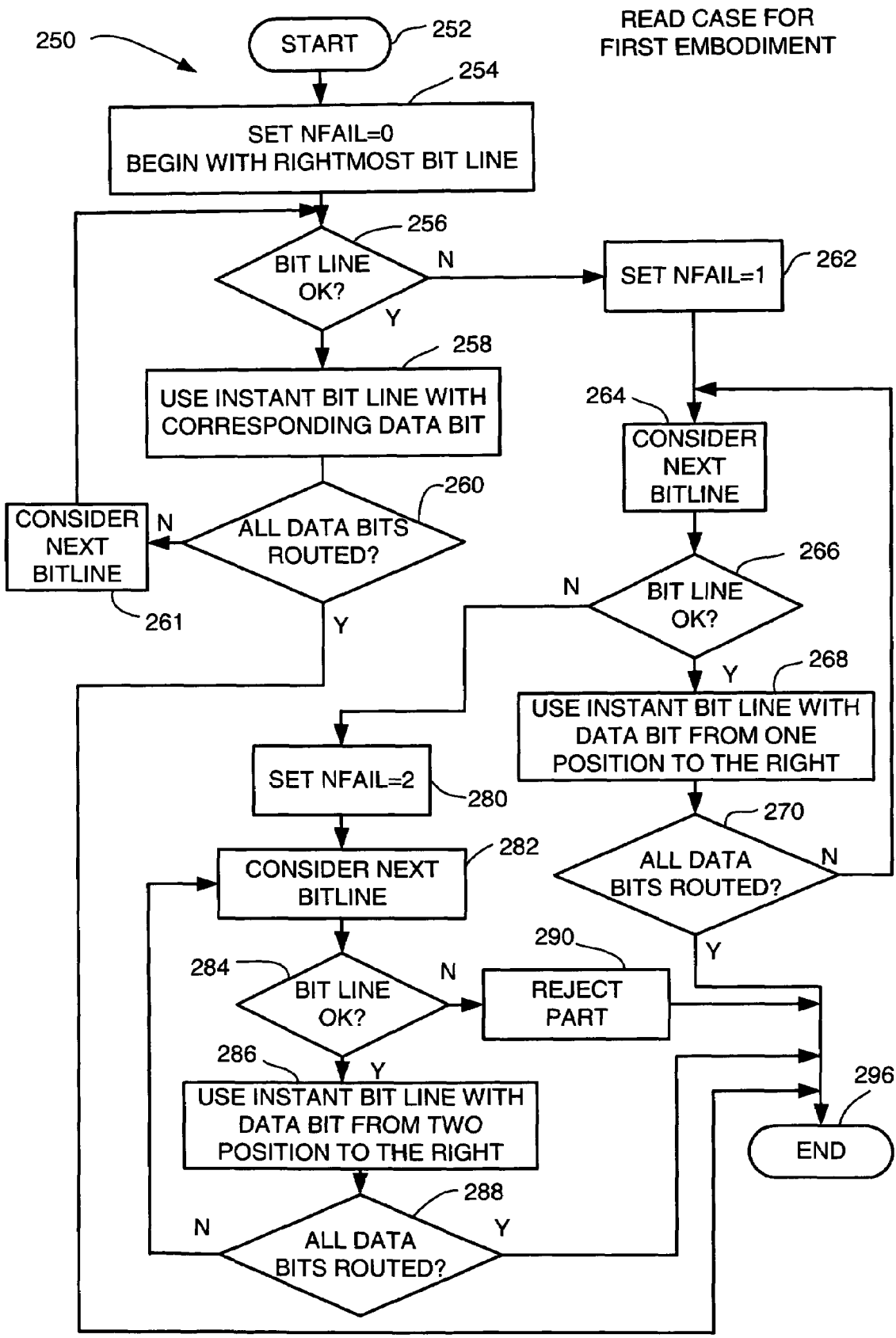
FIG. 2B is a flow chart of a read bit line to data signal selection for the first embodiment of the invention.

Method 250 is illustrated in FIG. 2B. Method 250 provides for read operations on array 160 of FIG. 1, implemented for the first embodiment of the invention (two or more spare bit lines, both of which are on the same side of array 160). Exemplary method 250 assumes that there are two spare bit lines, and those two spare bit lines are on the left side of array 160. Method 250 begins at step 252. In step 254, NFAIL (number of failing bit lines encountered so far) is set to zero. The rightmost bit line is set as the instant bit line.

Step 256 checks if the instant bit line is functional. If so, control passes to step 258, in which the instant bit line is routed to the corresponding data signal. For example, bit line BL2 is routed to data signal B2. Step 258 passes control to step 260 which checks if all data signals have been routed to non-failing bit lines. If not, step 261 sets the next leftmost bit line as the instant bit line. If all data signals have been routed a functional bit line, step 260 passes control to step 296, which ends method 250. If array 160 has no failing bit lines, steps 256, 258, 260, and 261 simply route bit lines BL0–BLn to data signals B0–Bn, respectively, and bit lines BLn+1 and BLn+2 are not routed to a data signal.

If step 256 has encountered a failing bit line (the first failing bit line from the right), control passes to step 262, which sets NFAIL=1 (that is, one failing bit line has been encountered).

Step 264 considers the next bit line (in the assumed right to left order) as the instant bit line. In step 266, if the instant bit line is functional, control passes to step 268, which routes the instant bit line to a data signal one position to the right. For example, if one failing bit line has been encountered, bit line BL4 is routed to data signal B3. Step 270 checks if all data bits have been routed from functional bit lines. If so, control passes to step 296 which ends method 250. If not, step 270 passes control to step 264. If step 266 determines that the instant bit line is failing, control passes to step 280.

Step 280 sets NFAIL=2, in other words, two failing bit lines have been encountered. Step 282 considers the next bit line (again in the right to left order) as the instant bit line. Step 284 checks to see if the instant bit line is functional. It will be understood that step 284 is not required if the part has already been discarded during testing as having more than two failing bit lines (the exemplary method 250 assumes that there are only two spare bit lines). If step 284 determines that the instant bit line is failing, control passes to step 290, which discards the part containing array 160, since, in the exemplary method, only two failing bit lines can be repaired with the two spare bit lines (BLn+1, BLn+2) supplied. It will be understood that additional spare bit lines can be supplied by a designer and that method 250 can be expanded to accommodate additional failing bit lines with the additional spare bit lines.

Methods 200 and 250 are implemented using select logic 125 and redundancy selector 130 previously discussed with reference to FIG. 1. A more detailed discussion of the apparatus will be undertaken now.

Figure 3:
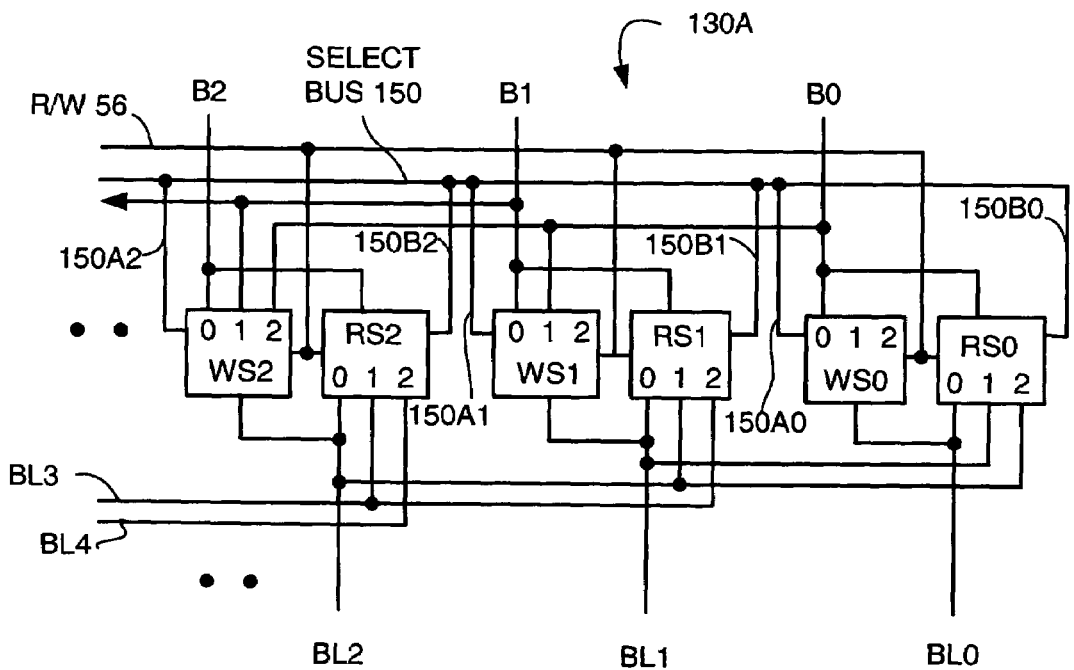
FIG. 3 shows a block diagram of read and write selectors suitable for implementing an apparatus that embodies the first method embodiment.

FIG. 3 illustrates how data signals B0, B1, and B2 are routed to non-failing bit lines during writes, and how non-failing bit lines are routed to data signals B0, B1, and B2 during reads by redundancy selector 130. FIG. 3 continues the exemplary embodiment of array 160 which has two spare bit lines at the left of array 160. Write selects WS0, WS1, and WS2, respectively, route a data signal onto bit lines BL0, BL1, and BL2, during writes, if bit lines BL0, BL1, and BL2 are non-failing, or, to non-failing bit lines if one or two of bit lines BL0, BL1, and BL2 are failing. Select bus 150 controls which data signal is routed from a particular write select WS onto a particular bit line. For example, a portion of select bus 150, select bus write portion 150A2, controls whether data signal B2, data signal B1, or data signal B0, is routed to bit line BL2 by write select WS2. Write select WS2 has data signal B2 coupled to input "0". Data signal B2 will therefore be routed to bit line BL2 when select bus write portion 150A2 has a value of "0". Similarly, data signal B1 will be routed to bit line BL2 when select bus write portion 150A2 has a value of "1". Finally, data signal B0 will be routed to bit line BL2 when select bus write portion 150A2 has a value of "2". It will be understood that "0", "1", "2" values on select bus portion 150A2 are used for exemplary purposes only and that any values that similarly route data signals to bit lines is contemplated. In a similar manner, select bus write portion 150A1 controls routing of data signals by write select WS1 to bit line BL1, and select bus write portion 150A0 controls routing of data signals by write select WS0 to bit line BL1. R/W 56 is coupled as an input to all write select blocks, e.g., in FIG. 3, WS0, WS1, and WS2. R/W 56 prevents each write select WS from driving their respective bit lines during reads, as will be explained later.

Read selects RS0, RS1, and RS2, shown in FIG. 3, are similarly each coupled to a select bus read portion 150B of select bus 150 and also to R/W 56. For example, read select RS2 is coupled to select bus read portion 150B2, which selects whether bit line BL2 (if select bus read portion 150B2="0"); bit line BL3 (if select bus read portion 150B2="1"); or bit line BL4 (if select bus read portion 150B2="2") is driven on to data signal B2 during a read. Similarly, select bus read portions 150B1 and 150B0 provide selection controls for read selects RS1, and RS0, respectively. R/W 56 prevents read selects RS from driving data signals B0–Bn during writes, as will be described in detail below.

Figure 4:
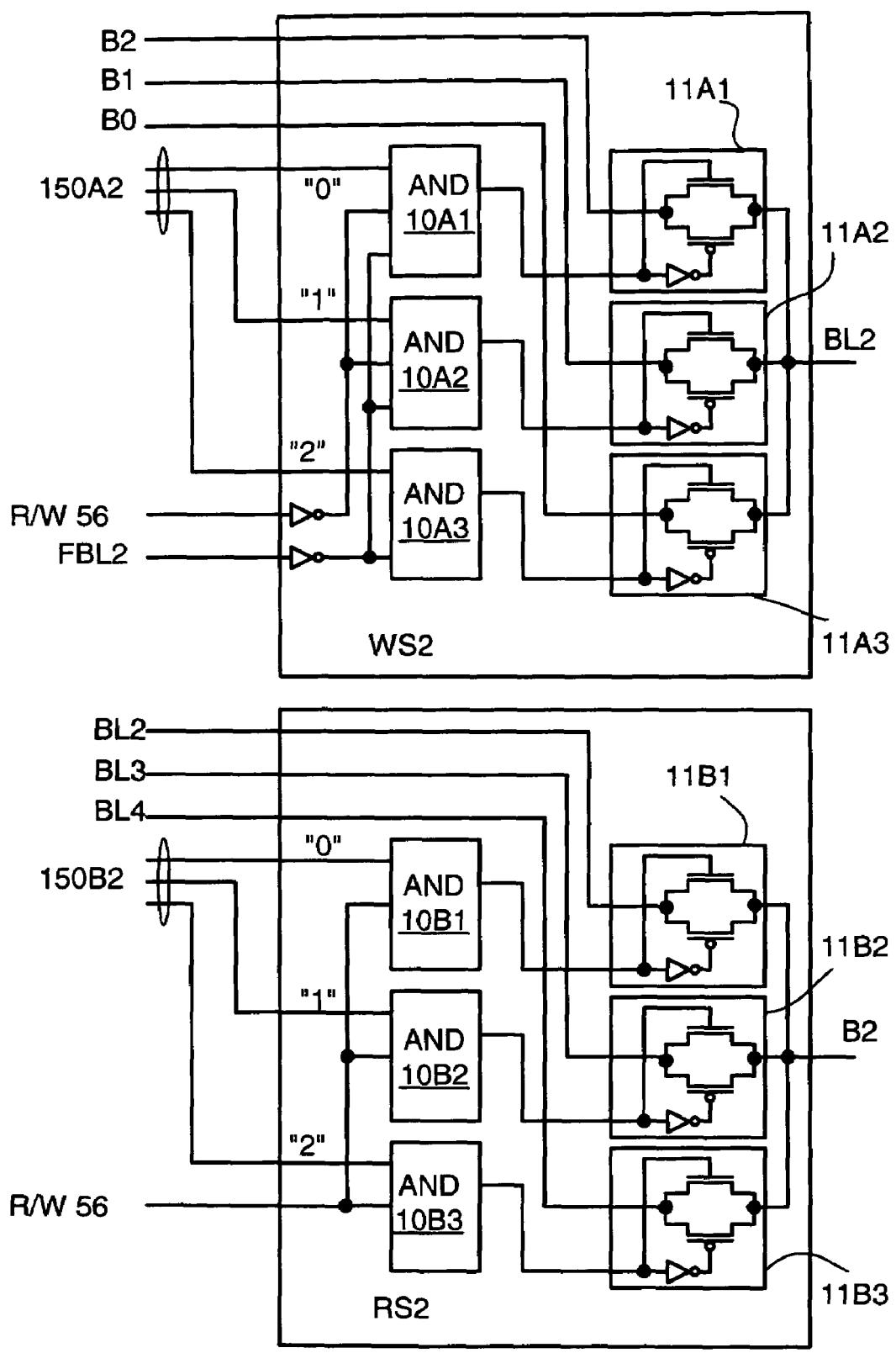
FIG. 4 shows a more detailed diagram of the read and write selectors of FIG. 3.

FIG. 4 shows an exemplary write select WS (write select WS2), and an exemplary read select RS (read select RS2), in greater detail than was shown in FIG. 3. Write select WS2, as explained, receives select bus write portion 150A2 to control whether data signal B0 (when select bus write portion 150A2="2"), B1 (when select bus write portion 150A2="1"), or B2 (when select bus write portion 150A2="0") is to be driven onto bit line BL2. Write select WS2 also receives R/W 56, which has a logical value of "1" for reads; and a logical value of "0" for writes. In an embodiment, bit line BL2 is not actively driven if bit line BL2 is a failing bit line. For example, if bit line BL2 is shorted to ground, a logical "1" driven onto bit line BL2 will cause some amount of current to be driven into the short circuited bit line BL2 unless write select WS2 is inhibited from driving bit line BL2. In another embodiment, bit line BL2 is driven whether it is failing or not.

In the exemplary embodiment of FIG. 4, FBL2 (a signal from fail map 110 indicating that bit line BL2 is failing) is received by write select WS2 and inhibits write select WS2 from driving bit line BL2 when bit line BL2 is failing. In an alternative embodiment wherein bit line BL2 is driven even when bit line BL2 is failing, FBL2 is not used by write select WS2. Write select WS2 comprises AND gate 10A1, which produces a logical "1" if select bus write portion 150A2 "0" asserted, R/W 56="0" (i.e., a write operation, and FBL2=logical "0" indicating that bit line BL2 is non-failing. BL2 must not be driven by WS2 during a read operation (R/W 56=logical "1"), because a memory cell (not shown) in array 160 addressed by a word line (not shown) drives bit line BL2 during the read operation.

Similarly, AND gate 10A2 produces a logical "1" if select bus write portion 150A2 has "1" asserted, R/W 56="0", and FBL2="0". AND gate 10A3 produces a logical "1" if select bus write portion 150A2 has a "2" asserted, R/W 56="0", and FBL2="0".

Outputs of AND gates 10A1, 10A2, 10A3 are coupled as control inputs to pass gates 11A1, 11A2, and 11A3, respectively. For example, signal B2 is passed to bit line BL2 through pass gate 11A1 if AND 10A1 outputs a "1".

It is assumed in this description of write select WS2 that select bus write portion 150A2 is fully decoded, that is, only one of "0", "1", or "2" is active at a given time. No signal is passed from WS2 if R/W 56="1" or FBL2="1". Other write selects WS are similarly designed.

Read select RS2 is also shown in FIG. 4, and routes one of three bit lines (BL2, BL3, or BL4) to data signal B2 during a read operation. Select bus read portion 152B2 controls which of bit lines BL2, BL3, or BL4 is routed to data signal B2 during the read operation. Other read selects RS are similarly designed. Control of which bit line is routed to data signal B2 is controlled by select bus read portion 150B2, a portion of select bus 150. R/W 56 is also input to read select RS2. AND gates 10B1, 10B2, 10B3, similarly to AND gates 10A1, 10A2, 10A3, provide control to pass gates 11B1, 11B2, and 11B3, to control which bit line (BL2, BL3, or BL4) is passed to data signal B2. If R/W 56="0", a write operation is active, and no signal is driven by read select RS2 to data signal B2, since storage control 55 (see FIG. 1) is actively driving logical values onto data signals B0–Bn during write operation.

It will be understood that there are many other ways to implement the write select WS and read select RS function, and that other methods of communicating to redundancy selector 130 are possible besides the fully decoded information described for exemplary purposes. For example, rather than the three signals shown for select bus write portion 150A2, two signals could be used, and a decode performed with logic (not shown) in WS2. In an implementation having more than two spare bits, encoding information on select bus 150 becomes more advantageous.

FIGS. 5A–5C show an exemplary embodiment of how select logic 125A (FIG. 5C), a write portion of select logic 125 (FIG. 1) uses information in fail map 110 to produce select bus write portions 150A of select bus 150. Select bus write portion 150A2 was described in reference to write select WS2, shown in FIG. 3 earlier. Write select generation block 120A shown in FIG. 5A is instantiated multiple times, once for each bit line as shown in FIG. 5C to make up a first portion, select logic 125A, of select logic 125 shown in FIG. 1.

As shown in FIG. 5A, an instance of write select generation block 120A receives the select bus write portion 150An of the previous write select generation block 120A and a bit from fail map 110, shown as FBLn, that indicates whether the bit line corresponding to the instant select generation block 120A is failing (logical "1") or nonfailing (logical "0"). The instance of select generation block 120A produces a select bus write portion 150An+1.

FIG. 5B shows the truth table of write select generation block 120A. "A", "B", and "C" columns are the select bus write portion 150A bits driven to the previous write select WS. "F" is a bit from fail map 110 for the instant bit line. For example, if there are no failing bit lines in array 160, select bus write portions 150A will be 100 (i.e., A="1"; B="0"; and C="0" for all select bus subportions, because all FBL bits from fail map 110 are "0". In the second row of the truth table of FIG. 5B, write select generation block 120A receives "100", but fail map 110 indicates that the present bit line is failing. In response, write select generation block 120A outputs select bus write portion 150A="010", and the corresponding write select WS will select the data signal according to the "1" select, as described with reference to FIG. 4 above. In the last row of the truth table of FIG. 5B, two fails have been encountered, and also the current FBL from fail map 110 indicates yet another fail. Outputs in that situation (i.e., the last row of FIG. 5B) are "don't-cares" because a third failure has been found and only two spares (in the exemplary embodiment) exist. The part can not be repaired. Typically a part is discarded at manufacturing (for example, at wafer test) of the chip if there are more failing bit lines than there are spare bit lines.

It will be recalled that discussion continues to describe the first embodiment of the invention, in which spare bit lines are at a single side of array 160. As described earlier, the exemplary method starts with the rightmost bit line and proceeds to the left, so that spare bit lines on the left are used if needed. It will be understood that the spare bit lines of the first embodiment can be placed on the right side, with the method starting from the left and proceeding to the right. In the example of FIG. 5C, it is assumed that the method starts from the rightmost bit line (i.e., bit line BL0), however, to show dataflow moving left to right as is the usual convention, it will be noted that FBL0 (a bit in fail map 110 that indicates whether bit line BL0 is failing) is on the left.

The select logic portion 125A example of FIG. 5C assumes six data signals and two spare bit lines (on the left side of array 160). A first instantiation of select generation block 120A, select generation block 120A0, receives "100" on its "ABC" inputs (there are no failing bit lines prior to the first bit line, BL0). FBL0 is received by select generation block 120A0, and is a "0" if bit line BL0 is functional, and "1" if bit line BL1 is failing. As described above, select bus write portion 150A0 and, in an embodiment of write select WS0, FBL0, are input to write select WS0. Similarly, select generation blocks 120A1–120A6 receive FBL1–FBL6, as well as select bus write portions 150A1–150A6, respectively. A failing bit line FBL7 (not shown in FIG. 5), in an embodiment, is input to write select WS7 to prevent bit line BL7 from being driven if bit line BL7 is failing. Write select WS7 is shown in FIGS. 7A–7D, to be described shortly.

FIGS. 6A–6C show an embodiment of select logic 125B (FIG. 6C), which handles read portions of select logic 125 (FIG. 1). Select logic 125B provides select bus read portions 150B, used by read select RS instantiations. Read select generation, for the first embodiment of the invention is slightly more complicated than the write select generation, since both the present bit and the next bit of fail map 100 data must be considered. A truth table for read select generation 120B is shown in FIG. 6B. Read select logic 120B is shown in FIG. 6A, and receives the previous select bus read portion 150B (150Bn−1), the corresponding bit from fail map 110 (FBLn), and the next bit from fail map 110 (FBLn+1). Read select generation 120B outputs select bus portion 150Bn, which is used by read select RSn. FIG. 6C shows read select generation blocks 120B0–120B5 coupled together as select logic portion 125B.

FIGS. 7A–7D show redundancy selector 130 (FIG. 1) for the first embodiment of the invention, with selections applied to write selects WS and read selects RS shown for various bit line failure assumptions. As before, array 160, for exemplary purposes, has two spare bit lines at the left side of the array, and six data signals, B0–B5. Write selects WS0–WS7 and read selects RS0–RS7 are shown, coupled to bit lines BL0–BL7, and to data signals B0–B5 as shown. Since read selects RS and write selects WS have been described in detail above, select bus write portions 150A and select bus read portions 150B are not shown in FIGS. 7A–7D. Instead, circles around selected data signal inputs indicate which inputs are selected, using the method and logic blocks previously described. Each bit line having a data signal routed to it has the data signal identification indicated in parenthesis.

Figure 7A:
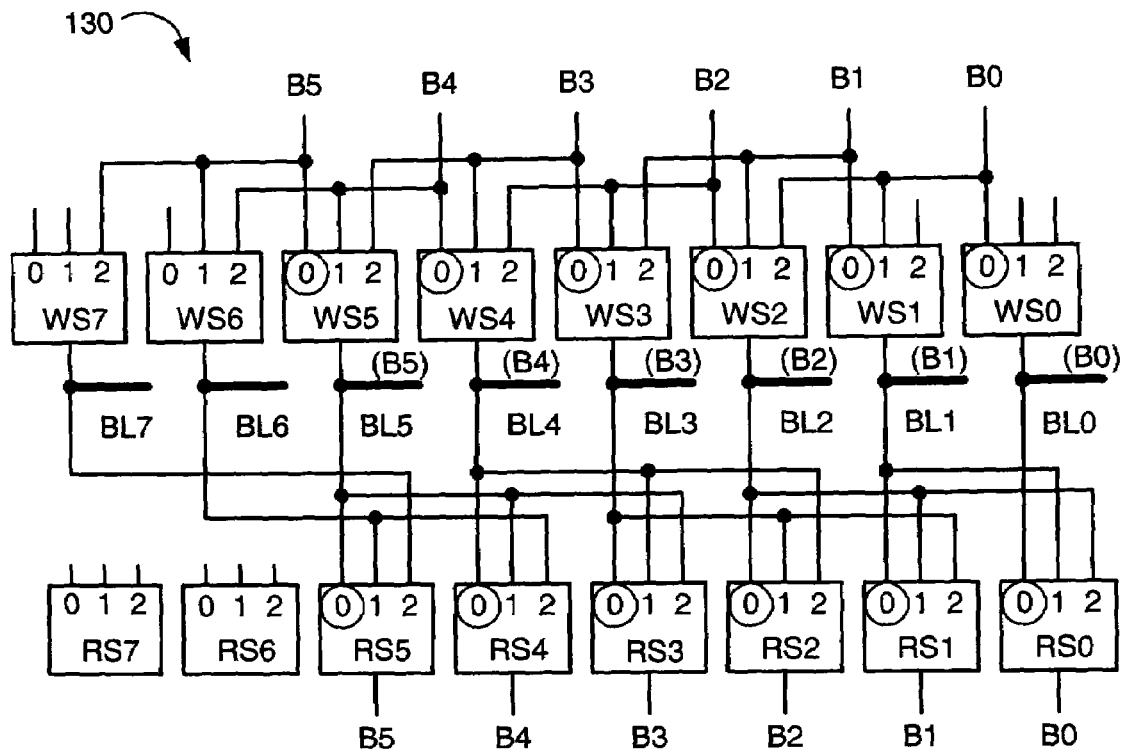
FIGS. 7A–7D show exemplary write and read selections used in the first embodiment for various bit line failure examples.

FIG. 7A illustrates how redundancy selector 130 route data signals to bit lines and bit lines to data signals when array 160 has no failing bit lines. Write selects WS0–WS5 all have their "0" input selected, routing data signals B0–B5 to bit lines BL0–BL5, respectively, during writes. WS6, WS7 are shown with no input selected, since bit lines BL6 and BL7 are not used. A designer could gate any of the three inputs to bit lines BL6, BL7. As shown, unused inputs to WSA6 and WSA7 are shown "hanging", for simplicity. In practice, a designer would typically couple unused inputs to a voltage supply, such as VDD or ground, to avoid floating inputs. Read selects RS0–RS5 are controlled as indicated by the circled inputs to route bit lines BL0–BL5 to data signals B0–B5, respectively, during read operations. It will be noted that read selects RS6, RS7 are never used. In an embodiment, read selects RS6, RS7 are omitted from the design of redundancy selector 130. In another embodiment, read selects RS6, RS7 are included, with inputs and outputs left floating or, more typically coupled to appropriate voltage supplies. Inclusion of RS6, RS7, provides for more consistent shapes in the array, which is sometimes of benefit in manufacturing.

The controls can also be thought of as "belonging to the data signals", rather than "belonging to the bit lines". It will be noted that there is a one-to-one correspondence between a data signal and a bit line on which data written from and read by that data signal is stored. It will further be noted that each data signal is connected to three write select WS blocks and is routed, during writes, through one of the three write select WS blocks, being controlled by a select bus write portion 150A value of "0", "1", or "2" as explained earlier. The "0", "1", or "2" direction for each data signal bit representing a bit in a write bit vector. For the example of FIG. 7A, a write bit vector (to steer each data signal to a bit line) is 0,0,0,0,0,0 that is, each data signal is routed to its corresponding bit line. Similarly, each data signal has a read bit vector to select which bit line is routed to the data signal during a read. For the example of FIG. 7A, this bit vector is also 0,0,0,0,0,0 meaning that each data signal receives data from its corresponding bit line.

Figure 7B:
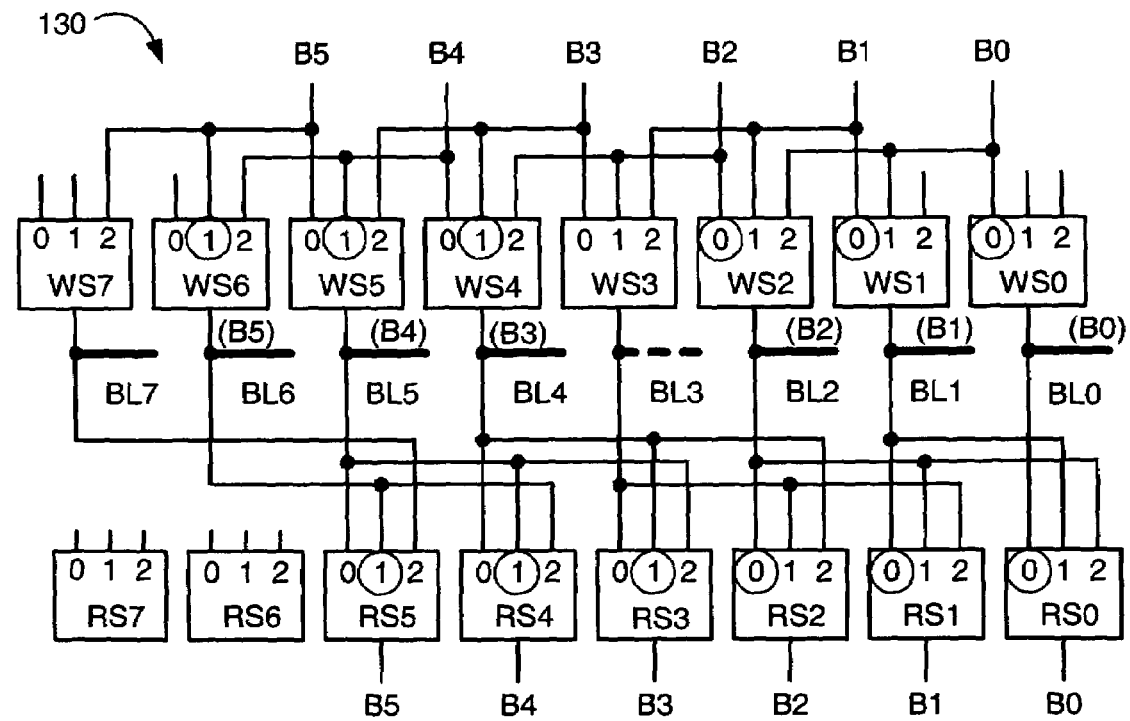

In the example of FIG. 7B, bit line BL3 is failing, as indicated by the dashed line depicting bit line BL3. Inputs to write selects route data signals to functional bit lines as taught above. Data signals B0–B5 are routed to, respectively, BL0, BL1, BL2, BL4, BL5, and BL6. Note that WS3 has no circled inputs, since it is a don't-care as to which data signal is routed to bit line BL3, since bit line BL3 is failing. As explained earlier, in an embodiment, bit line BL3 is not driven when bit line BL3 is failing. As before, any input can be routed to bit line BL7, since it is not relied upon to store data in the example of FIG. 7. Again, inputs shown as "hanging" are typically coupled to a voltage supply such as VDD or ground. Read select RS0 routes bit line BL0, which contains data previously written from data signal B0, back to data signal B0 during a read operation. Similarly, read select RS1 routes data from bit line BL1 to data signal B1. Read select RS2 routes data from bit line BL2 to data signal B2. Read select RS3 routes data from bit line BL4 to data signal B3. Read select RS4 routes data from bit line BL5 to data signal B4. Read select RS5 routes data from bit line BL6 (a spare bit line) to data signal B5.

Considering the example of FIG. 7B in terms of write and read bit vectors associated with each data signal, the write bit vector is 0,0,0,1,1,1. That is, data signals B0, B1, B2 receive data from their corresponding bit line, and data signals B3, B4, and B5 receive data from bit lines "one to the left" of the corresponding bit lines. The read bit vector is 0,0,0,1,1,1. That is, data signals B0, B1, and B2 receive data from their corresponding bit lines, but data signals B3, B4, and B5 receive data from bit lines "one to the left" of their corresponding bit lines.

Figure 7C:
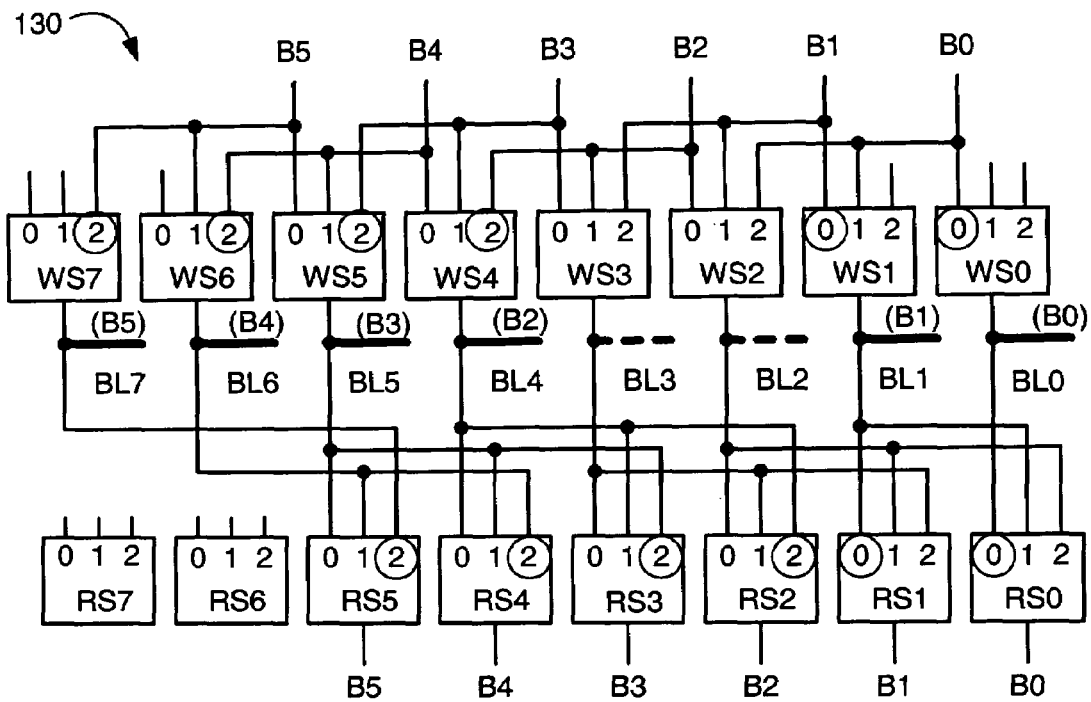

In the example of FIG. 7C, two adjacent bit lines, BL2 and BL3, are failing, as indicated by dashed lines for bit lines BL2 and BL3. During write operations, write selects WS0 and WS1 route data from data signals B0 and B1, respectively, to bit lines BL0 and BL1. Write selects WS4–WS7 route data from data signals B2–B5, respectively, to bit lines BL4–BL7. As before, input selects to write selects WS2 and WS3 are "don't-cares" since bit lines BL2 and BL3 are not functional. In an embodiment, when a particular bit line is not functional, the corresponding write select does not drive the bit line. Similarly, read selects RS0–RS5 are controlled to route data from the appropriate functional bit lines to data signals B0–B5 during read operations, as shown in FIG. 7B.

Considering the example of FIG. 7C in terms of write and read bit vectors associated with each data signal, the write bit vector is 0,0,2,2,2,2. That is, data signals B0, and B1 receive data from their corresponding bit line, and data signals B2, B3, B4, and B5 receive data from bit lines "two to the left" of the corresponding bit lines. The read bit vector is 0,0,2,2,2,2. That is, data signals B0, and B1 receive data from their corresponding bit lines, but data signals B2, B3, B4, and B5 receive data from bit lines "two to the left" of their corresponding bit lines.

Figure 7D:
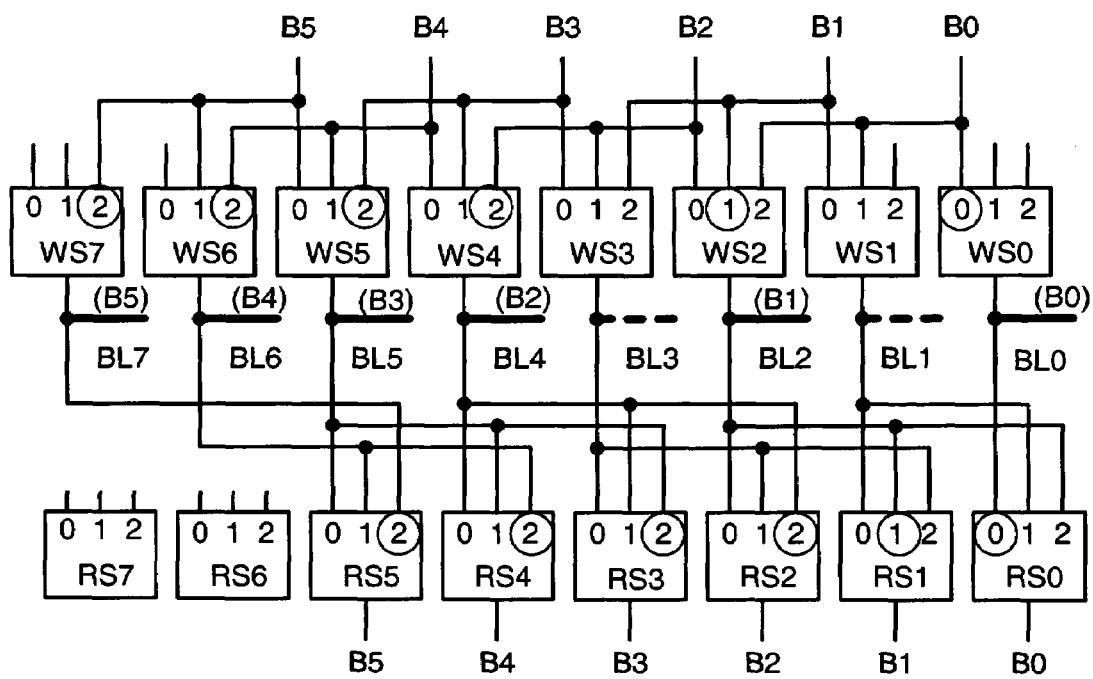

In the example of FIG. 7D, two nonadjacent bit lines, BL1 and BL3, are failing, as indicated by dashed lines on bit lines BL1 and BL3. During write operations, write select WS0 routes data signal B0 to bit line BL0. Write select WS2 routes data signal B1 to bit line BL2. Write select WS4 routes data signal B2 to bit line BL4. Write select WS5–WS7 route data signals B3–B5 to bit lines BL5–BL7, respectively. Read selects RS0–RS5 route, as shown, data from the appropriate bit lines to data signals B0–B5 during read operations. It will be noted that select bus portion 150A2 ("1") differs from select bus portion 150B2 ("2") in this example. That is, write select WS2 needs to be controlled with a "1" to route data from data signal B1 to bit line BL2 (that is, WS2 must "reach to the right one position". However, RS2 must "reach to the left two positions" and be controlled with a "2" to route data from bit line BL4 to data signal B2, since the next bit line to the left, BL3, is not functional. The truth tables for select bus portion generation shown in FIG. 5B and FIG. 6B accomplish this difference.

Considering the example of FIG. 7D in terms of write and read bit vectors associated with each data signal, the write bit vector is 0,1,2,2,2,2. That is, data signal B0 receives data from its corresponding bit line. Data signal B1 receives data from a bit line "one to the left" of its corresponding bit line. Data signals B2, B3, B4, and B5 receive data from bit lines "two to the left" of the corresponding bit lines. The read bit vector is 0,1,2,2,2,2. That is, data signal B0 receives data from its corresponding bit line. B1 must "reach one bit line to the left". Data signals B2, B3, B4, and B5 receive data from bit lines "two to the left" of their corresponding bit lines.

DESCRIPTION OF THE SECOND EMBODIMENT OF THE INVENTION

The second embodiment of the invention is illustrated as method 300 in FIG. 8. In the exemplary embodiment of method 300, an array 160 having one spare bit line on the right and one spare bit line on the left is shown.

A first advantage of the second embodiment is that, If only two spare bits are implemented, the second embodiment needs only a single select bus 150 portion for each bit line instead of a separate select bus portion 150A and a select bus read portion 150B as explained earlier for the first embodiment, which is needed, as explained earlier to avoid routing problems that arise in certain circumstances when a data signal must bypass more than one failing bit line. That is, in the second embodiment of the invention, the same select bus portion "can" be used for each corresponding write select WS and read select RS. It will be noted that, at the ends of array 160, a degenerate version of a select bus portion 150A or select bus portion 105B could also be used. For example (FIG. 7A), WS0 has only data signal B0 as an input. Similarly, also as seen in FIG. 7A, read selects RS7 and RS6, if implemented at all, have no connected inputs or outputs. Similar degenerate write selects WS and read selects are seen in FIGS. 9A–9D, which depict connections to data signals and bit lines for the second embodiment. In the second embodiment, the same select bus portion can be used (i.e., the same logical values used to control the blocks) with all corresponding read select RS and write select WS blocks, which is not possible with the first embodiment of the invention. For example, in FIG. 7D, it will be noted that WS2 has a "1" supplied on select bus write portion 150A, but a "2" supplied on read select RS2 by select bus read portion 150B. In particular, the same logical values on select bus portions are used to control each nondegenerate read select RS and the corresponding write select WS block.

Select logic 125, however, is, in general, more complicated in the second embodiment than in the first embodiment. If more than one spare bit is implemented on each side of array 160, then both a select bus write portion 150A and a select bus read portion 150B is required, for the same reasons explained in reference to the first embodiment of the invention.

A second advantage of the second embodiment is that, in many chips, the spare bit lines are not used. That is, in many arrays 160, all the non-spare bit lines are functional. In many processes, the "outer" shapes of an array 160 are not always built with the same quality as the "inner" shapes. Bit lines on the sides of arrays are "outer" shapes in this context. In the first embodiment, a non-spare bit line is an "outer" shape. In the second embodiment, spare bit lines, which are not always used, are the "outer" shapes.

Method 300 begins at step 302. Method 300 starts from the "left" of the array, finds a failing bit line, and makes shifts of data signals to a bit line "one to the left" so that the spare bit line on the left is used. If a second failing bit line exists, method 300 then starts from the "right" of the array, finds the second failing bit line, and makes shifts of data signals to a bit line "one to the right" so that the spare bit line on the right is used. Any remaining data signals (that is, data signals between the data signals routed "one to the left" and the data signals routed "one to the right" are routed to bit lines without shifting either right or left.

In step 304, a check is made during testing of the array (such as array 160 in FIG. 1) to see if all regular, or non-spare, bit lines are functional. If all non-spare bit lines are functional, control passes to step 316, and all data signals are routed to their corresponding bit lines. If step 304 determines that all non-spare bit lines are not functional, control passes to step 320. Step 320 checks to see if there are more failing bit lines than there are spare bit lines (two spare bit lines are assumed in the example method 300). If so, the part is rejected in step 322, and the method ends at step 326.

If step 320 determines that the array has fewer failing bit lines than spare bit lines, the array can be repaired, and control passes to step 306. Step 306 checks if the left spare bit line is functional. If the left spare bit line is functional, control passes to step 308. In step 308, all data signals are routed to a bit line one to the left up to, and including the data signal that would normally correspond to a first failing non-spare bit line. In step 310, a check is made to see if there is a second failing bit line. If not, control passes to step 316, which routes remaining data signals to their corresponding bit lines. If step 310 determines that a second failing bit line exists, control passes to step 312. Step 312 determines if the right spare bit line is functional. If not, control passes to step 322 and the part is rejected because the second failing non-spare bit line has no functional spare bit line to use as a repair. If the right spare bit line is functional, step 312 passes control to step 314. Step 314 routes the group of data signals consisting of the particular data signal that normally corresponds with the second failing bit line, and all remaining data signals "to the right" of the particular data signal, to bit lines "one to the right" of the bit lines that bit lines in the group of data signals would normally correspond with. For example, bit line BL0 is the spare bit line at the right of array 160 (FIG. 1). If bit line BL2 is failing, data signal B step 314 passes control to step 316, which routes any remaining data signals to their corresponding bit lines. Step 316 then passes control to step 326 which ends method 300.

Selection circuitry, including write selects WS and read selects RS are similar in circuit detail to those explained in reference to the first embodiment, such as is shown in FIG. 4. Failing bit line signals (e.g., FBL2), in embodiments, can again be used in write select WS blocks to cause failing bit lines to not be driven. R/W 56 is again used to cause write selects WS to not drive bit lines during reads and data signals B0–Bn to not be driven by read selects RS during writes. Select bus 150 is again assumed to be fully decoded to write selects WS and read selects RS.

Figure 9A:
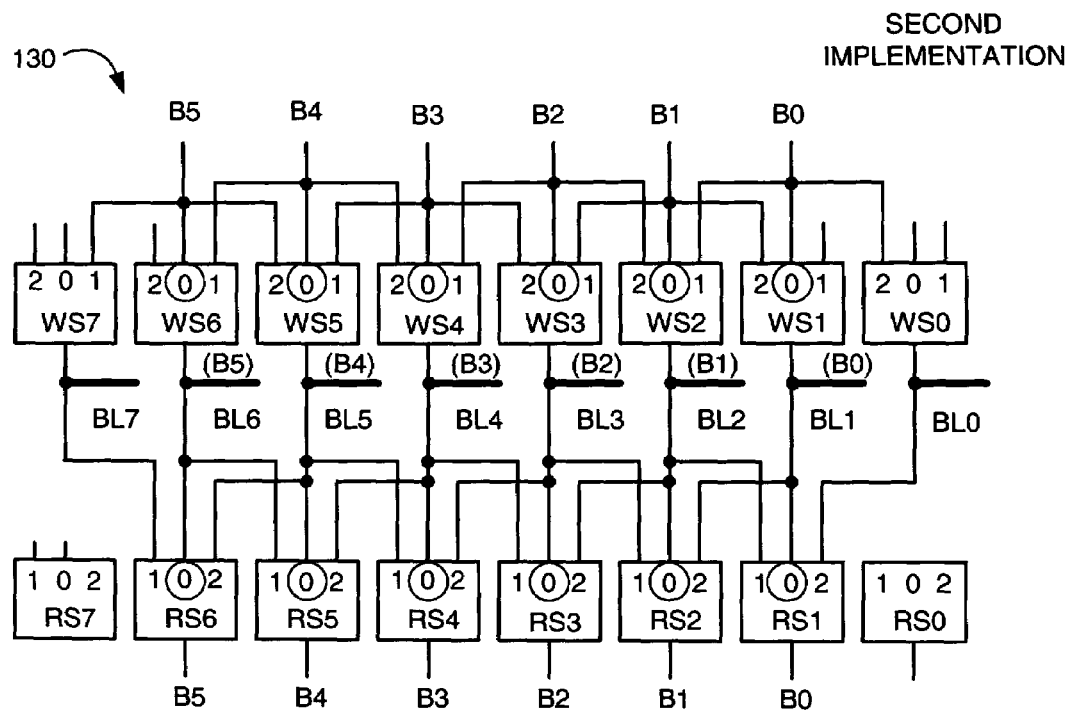
FIGS. 9A–9D show exemplary write and read selections used in the second embodiment of the invention for various assumed bit line failures.

FIG. 9A shows an example of selections made by redundancy selector 130 (shown in FIG. 1), using the second embodiment of the invention, having no failures on non-spare bit lines. Bit lines BL1–BL6, in the second embodiment, correspond to data signals B0–B5. BL0 is a spare bit line "on the right" of array 160; BL7 is a spare bit line "on the left" of array 160. (Array 160 is shown in FIG. 1). Since there are no failures on bit lines BL1–BL6, write selects WS1–WS6 are all controlled with "0"—that is, they are controlled to route data signals without shifting them "left" or "right" during write operations. As before, bit lines having data from a data signal are shown with the data signal identified by parentheses; for example, in FIG. 9A, bit line BL4 is shown as having (B3), that is, data written from and read to data signal B3. Similarly, read selects RS1–RS6 all receive "0" control information from select bus 150 and route their respective bit lines to corresponding data signals during read operations. It will be noted that RS0 and RS7 are never used and, in embodiments, are not implemented. Unused inputs on write selects and read selects, as before, are typically tied to a voltage supply.

Figure 9B:
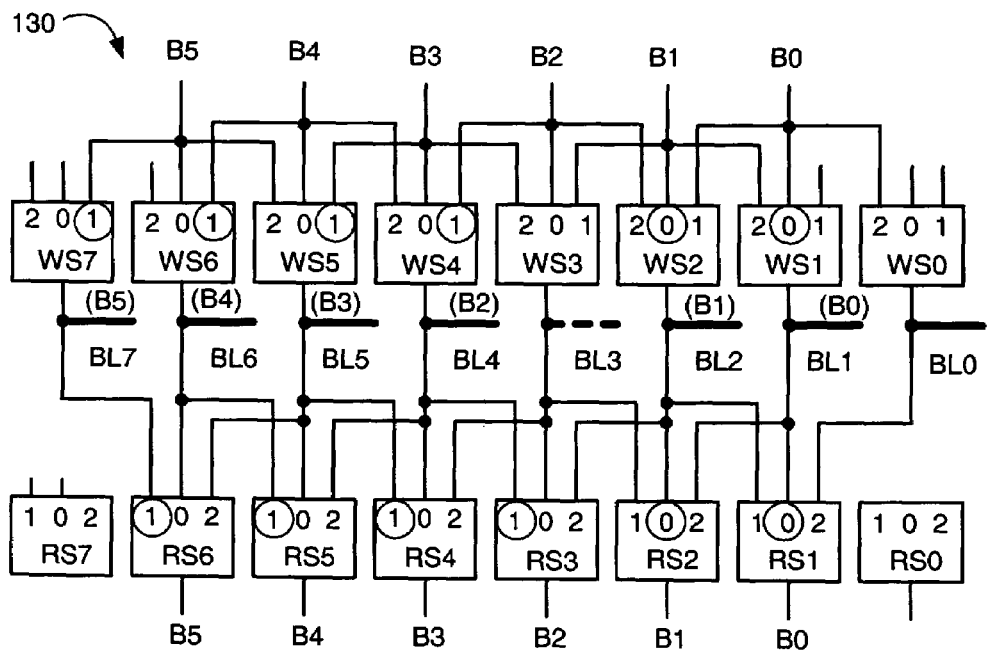

FIG. 9B shows an example of redundancy selector 130, with write selects and read selects showing interconnection; control from select bus 150 is again identified by circles on selected inputs. Bit line BL3 is shown, by dotted line, as being a failing bit line. According to method 300, bit line BL7, the left spare bit line, is used, with data signal B2, B3, B4, and B5 all routed to a bit line "one to the left", as shown. A "1" selection control on a write select block routes a data signal "one to the right" to an instant bit line. For example, WS4 routes data signal B2 to bit line BL4, as shown. Read selects RS1–RS6 are controlled as indicated by the circled input to route data from bit lines to B0–B5. Data signal B0 receives data during reads from bit line BL1; B1 from BL2; B2 from BL4; B3 from BL5; B4 from BL6; and B5 from BL7 (the spare bit line on the left). Spare bit line BL0 is not used in the example of FIG. 9B.

Figure 9C:
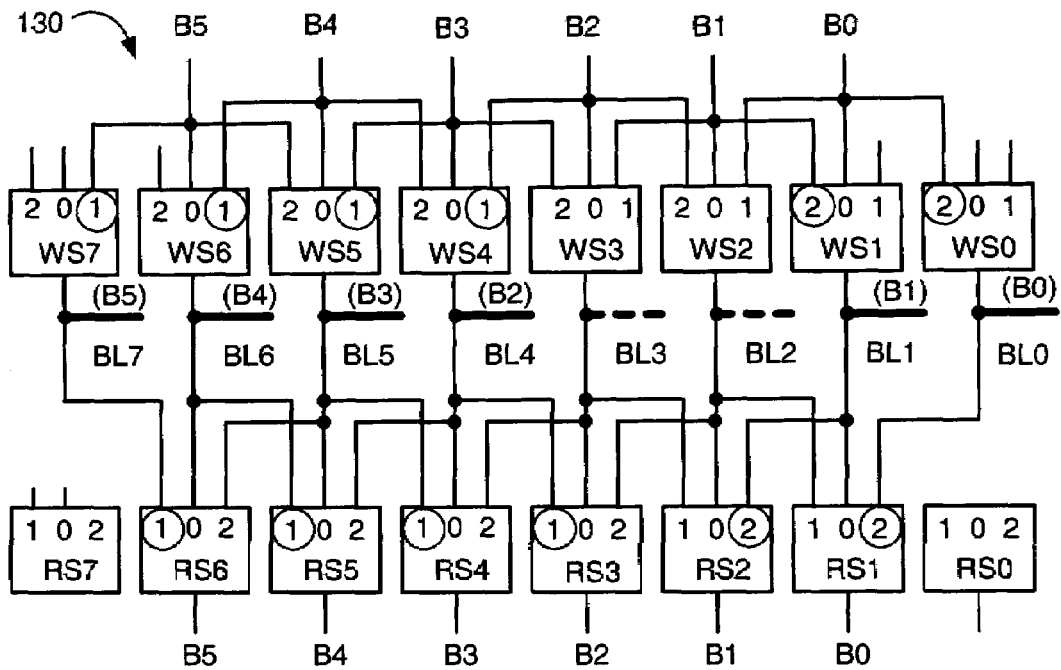

FIG. 9C shows an example of redundancy selector 130, with write selects and read selects showing interconnection. Control from select bus 150 is again identified by circles on selected inputs. Bit lines BL2 and BL3 are shown, by dotted lines, as being failing bit lines. Write selects, according to method 300, and read selects, also according to method 300, are controlled to use spare bit line BL7 first, accounting for the first failing bit line from the left, i.e., bit line BL3, and spare bit line BL0, accounting for the first failing bit line from the right, i.e., bit line BL2. Write selects WS0 and WS1 are controlled with "2" in order to, respectively, route data signals B0 and B1 to bit lines BL0 and BL1. Write selects WS4–WS7 are controlled with "1" in order to, respectively, route data signals B2–B5 to bit lines BL4–BL7. Similarly, RS1 and RS2 are controlled with "2" in order to route the B0, B1 data, stored on bit lines BL0, BL1 to data signals B0 and B1, respectively. Read selects RS3–RS6 are controlled with "1" to "reach left by one position" to route data on bit lines BL4–BL7 to data signals B2–B5, respectively.

Figure 9D:
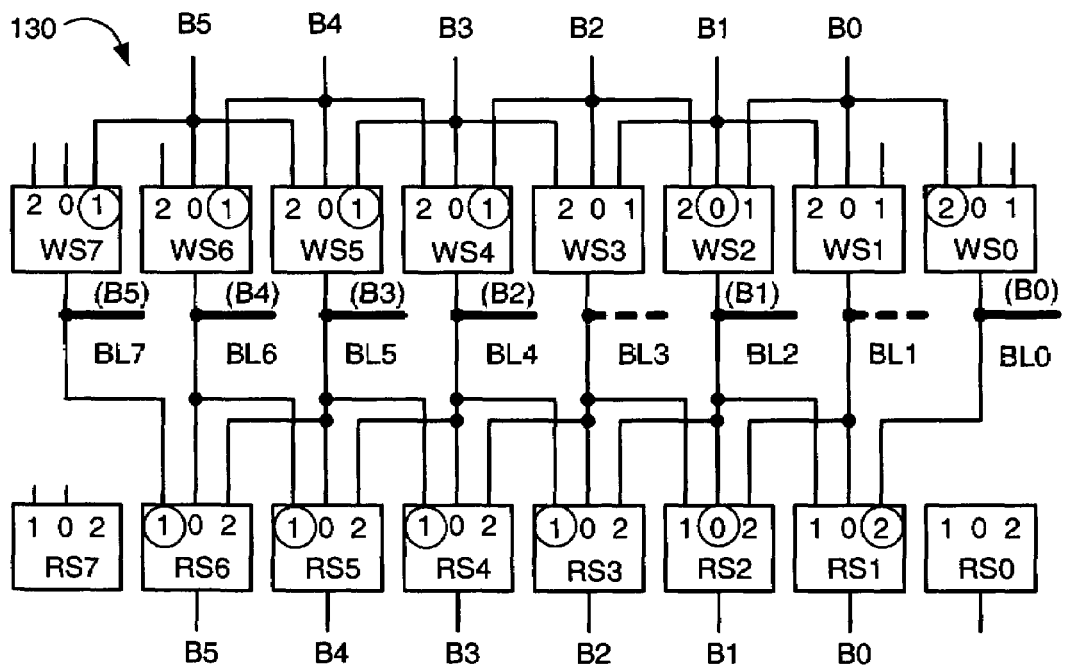

FIG. 9D shows an example of redundancy selector 130, with write selects and read selects showing interconnection. Control from select bus 150 is again identified by circles on selected inputs. In FIG. 9D, nonadjacent bit lines BL1 and BL3 are failing. Control is imposed on write selects, as shown by circled inputs, to route data signals left, starting from and including data signal B2, to avoid failing bit line BL3, and to route data signals right, starting from and including data signal B0 to avoid failing bit line BL1. Data signal B1 is routed to bit line BL2, its corresponding bit line. Control is imposed on read selects, as shown by circled inputs, to route data to data signals B0–B5. It will be noted that the same select bus 150 signals can be imposed on corresponding write select and read select blocks. That is, WS0–WS7 can receive the same control signals as RS0–RS7. It will be noted that on write select blocks driving a failing bit line control is a "don't-care".

FIG. 10 shows an exemplary select logic 125, shown as having portions 125C and 125D, suitable for controlling redundancy selector 130 (FIG. 1) of the second embodiment of the invention when there is a single spare bit line on each side of array 160 (FIG. 1). It will be recalled that, in the example, bit lines are checked, from the left, for the first failing bit line from the left, and control on write selects WS and read selects RS are imposed to route data signals "to bit lines on the left", and to route bit lines to corresponding data signals during reads, to bypass the first failing bit from the left. Then, if there is a second failing bit line, bit lines are checked, from the right, for the first failing bit line from the right, and control on write selects WS and read selects RS are imposed to route data signals "to bit lines to the right", and to route bit lines to corresponding data signals during reads, to bypass the first failing bit from the right.

Select logic portion 125C provides for checking for the first failing bit line from the left and providing appropriate control to redundancy selector 130 (i.e., write selects WS and read selects RS) as explained above. Select logic portion 125D provides for checking for the first failing bit line from the right (if there are two failing bit lines) and providing appropriate control to redundancy selector 130.

In select logic portion 125C, inputs from fail map 110 provides FBL0–FBL7 failing bit line data. A chain of OR gates begins propagating a logical "1" upon encountering the first failing bit line from the left. Nodes A–G are shown on a first portion of the chain of OR gates. A second portion of the OR chain goes "right to left", with first inputs of the second portion of the chain of OR gates connected to outputs of OR gates in the first portion of the chain of OR gates as shown. A group of XOR (exclusive OR) gates each has a first input connected to an output of an OR gate in the first portion of the chain of OR gates and a second input connected to an output of an OR gate in the second portion of the chain of OR gates, as shown. Select logic portion 125C provides outputs of the XOR gates that are all logic "0" if there are no failing bit lines. If there is a failing bit line, XOR gates will output a logic "1" up to and including that failing bit line, and a logic "0" thereafter. These logic outputs, LS0–LS5 are "left shift" control signals used to control redundancy selector 130 as shown in FIG. 11.

In select logic portion 125D, inputs from fail map 110 provides FBL0–FBL7 failing bit line data. Select logic portion 125D is responsible for providing "right shift" control signals used to control redundancy selector 130 if a second failing bit line is encountered, according to method 300. If a single bit line is failing, the corresponding data signal should not be routed both "left" and "right". To prevent shifting the data signal both left and right, select logic portion 125D has a group of AND gates, each AND gate receiving an input from fail map 110 with FBL0–FBL7 to identify failing bit lines. A second input of each AND gate is coupled to a node A–G from select logic portion 125C. The second input will ensure that a data signal is not routed both to the left and to the right. The remaining logic in select logic portion 125D operates similarly to the chain of Ors and the XOR blocks of select logic portion 125C, except that it begins at the right, instead of at the left of the bit lines.

Figure 11B:
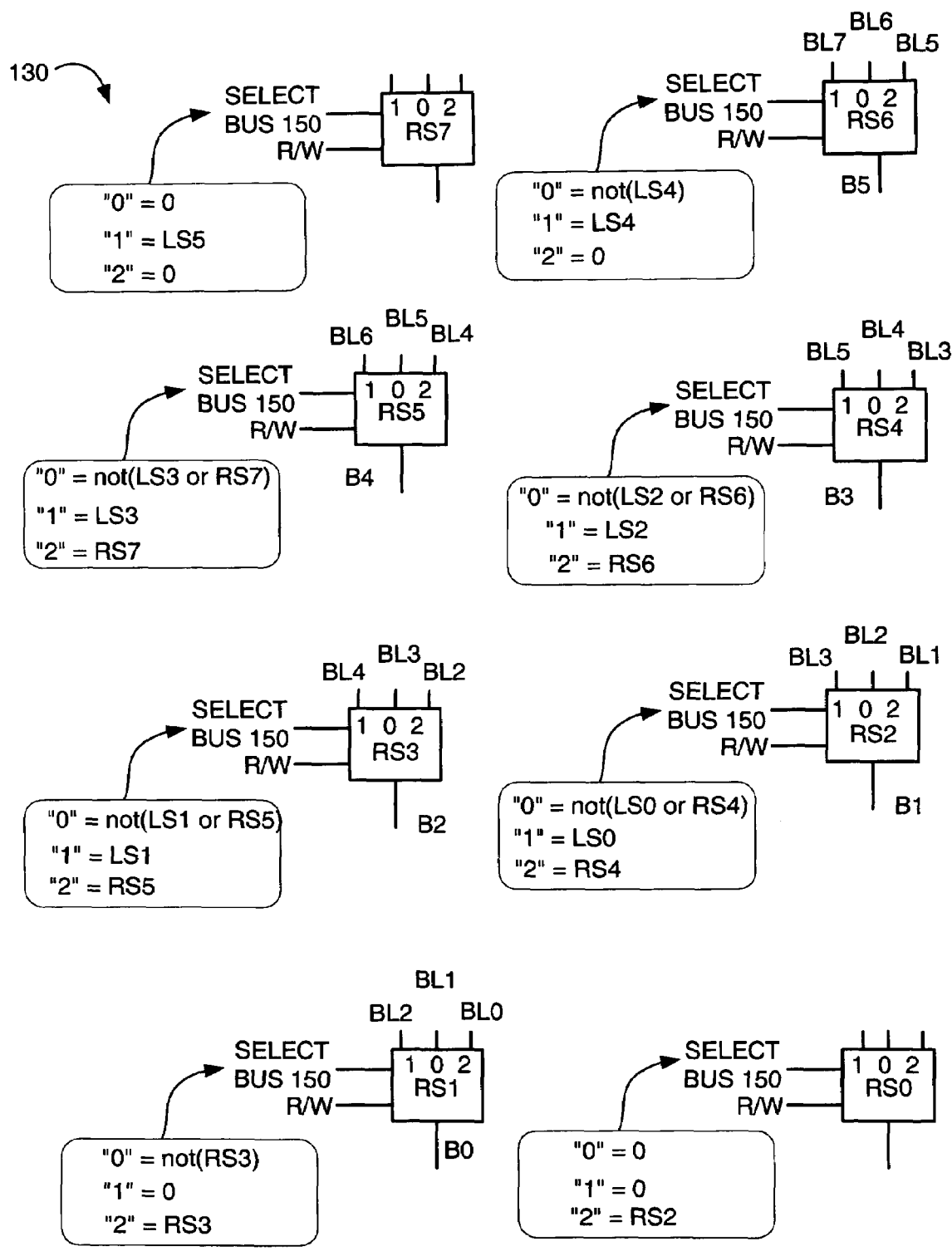
FIG. 11B shows details of selection controls applied to each read selector in the redundancy selector used in the second embodiment.

FIG. 11A shows the write select WS blocks of redundancy selector 130. As explained earlier for the second embodiment of the invention, with one spare bit line on each side of array 160, read select blocks RS are controlled by the same select bus bits as the corresponding write select blocks WS, as shown in FIG. 11B. Each write select (WS0–WS7) receives its select bus 150 portion having a value "0" (no shift), "1" (data signal shifted left), or "2" (data signal shifted right). Logical equations showing derivation of the "0", "1", and "2" are shown for each write select. Signals LS0–LS5, RS2–RS7 are generated as shown in FIG. 10 and described in reference to FIG. 10.

Read select RS0–RS7 blocks (FIG. 11B) receive the same select bus 150 portion as the corresponding write select WS blocks. It will be noted that read selects RS0 and RS7 do not drive any data signal, and, in an embodiment of redundancy selector 130 are not implemented. In another embodiment, read selects RS0 and RS7 are included in the implementation of redundancy selector 130, with inputs coupled to suitable voltage supplies such as VDD or ground as described earlier; this is allowable since read selects RS0 and RS7 are not used, inputs to read selects RS0 and RS7 are "don't-cares".

What is claimed is:

1. An array system capable of repairing multiple independent bit line failures, the array system comprising:
   an array, having a first side and a second side, comprising a plurality of bit lines between the first side and the second side, the plurality of bit lines further comprising:
      a plurality of non-spare bit lines; and
      a plurality of spare bit lines;
   a fail map capable of storing identities of failing bit lines;
   a storage control that drives a plurality of data signals for storage in the array during a write to the array and which reads the plurality of data signals during a read from the array, a number of signals in the plurality of data signals being equal to a number of non-spare bit lines in the plurality of non-spare bit lines, a number of spare bit lines being equal to a difference of a total number of bit lines in the plurality of bit lines and the number of non-spare bit lines, the number of spare bit lines being two or greater;
   a redundancy selector, coupled to the plurality of data signals and to the plurality of bit lines, that routes each data signal in the plurality of data signals to a functional bit line in the plurality of bit lines, the redundancy selector capable of utilizing more than one of the spare bit lines if there are more than one failing bit line in the plurality of non-spare bit lines; and
   a select logic coupled to the fail map, and further coupled to the redundancy selector, capable of controlling the redundancy selector to route each data signal in the plurality of data signals to a functional bit line in the plurality of bit lines, and to route to each data signal in the plurality of data signals data from the functional bit line used to store data from each data signal.

2. The array system of claim 1, the coupling of the select logic to the redundancy selector further comprising:
   a select bus further comprising:
      a plurality of select bus write portions used to control routing of data signals to functional bit lines during writes; and
      a plurality of select bus read portions used to control routing to data signals from functional bit lines during reads.

3. The array system of claim 2, the redundancy selector further comprising:
   a plurality of write selects, each instant write select having an output coupled to a bit line in the plurality of bit lines, and a number of inputs each coupled to a data signal in the plurality of data signals, each instant write select receiving a select bus write portion to control routing one input of the number of inputs to the output of the instant write select;
   wherein the plurality of write selects route each data signal in the plurality of data signals to a nonfailing bit line in the plurality of bit lines.

4. The array system of claim 3, the redundancy selector further comprising:
   a plurality of read selects, each instant read select having an output coupled to a data signal in the plurality of data signals, and a number of inputs each coupled to a bit line in the plurality of bit lines, each instant read select receiving a select bus read portion to control routing one of the input of the number of inputs to the output of the instant read select;
   wherein the plurality of read selects route to each data signal in the plurality of data signals from a nonfailing bit line.

5. The array system of claim 4, wherein all of the spare bit lines in the plurality of spare bit lines are located between the first side of the array and the plurality of non-spare bit lines.

6. The array system of claim 5, wherein at least one particular write select of the plurality of write selects has a number of data inputs, each data input coupled to a data signal in the plurality of data signals, the number of data inputs equal to the number of spare bit lines plus one;
   wherein the particular write select is configured to, under control of the select bus write portion coupled to the particular write select, during a write:
   route a first data signal to first bit line corresponding to the first data signal if there are no failing bit lines between the second side of the array and the bit line corresponding to the first data signal;
   route a second data signal to the first bit line if there is a first failing bit line between the second side of the array and the first bit line, the second data signal corresponding to a second bit line closer to the second side of the array than the first bit line;
   route a third data signal to the first bit line if there is a second failing bit line between the second side of the array and the first bit line, the third data signal corresponding to a third bit line closer to the second side of the array than the first bit line.

7. The array system of claim 6, wherein a first write select is configured to not drive a first failing bit line coupled to the output of the write select if the bit line coupled to the output of the write select is a failing bit line.

8. The array system of claim 6, each data signal in the plurality of data signals coupled to an output of a read select, each read select configured to be controlled by a select bus read portion supplied by the select logic, at least one particular read select of the plurality of read selects having a number of data inputs, each data input coupled to a bit line in the plurality of bit lines, the number of data inputs equal to the number of spare bits plus one;
   wherein the particular read select is configured to, under control of the select bus read portion coupled to the particular read select, during a read:
   route to the first particular data signal a first particular bit line that corresponds to the first particular data signal if there are no failing bit lines between the second side of the array and the first particular bit line, including the first particular bit line;
   route to the first particular data signal a second particular bit line upon which data from the first particular data signal was stored if there exists one failing bit line between the second side of the array and the first particular bit line, including the first particular bit line;
   route to the first particular data signal a third particular bit line upon which data from the first particular data signal was stored if there exists two failing bit lines between the second side of the array and the first particular bit line, including the first particular bit line;
   route to the first particular data signal a third particular bit line upon which data from the first particular data signal was stored if there exists two failing bit lines between the second side of the array and the first particular bit line, including the first particular bit line.

9. The array system of claim 4, wherein a first spare bit line is between the first side of the array and the non-spare bit lines, and a second spare bit line is between the second side of the array and the non-spare bit lines;

wherein the first spare bit line is used if there is a first failing bit line in the plurality of non-spare bit lines; and wherein the second spare bit line is used if there is a second failing bit line in the plurality of non-spare bit lines.

10. The array system of claim 9, the plurality of write selects further comprising a plurality of nondegenerate write selects, each nondegenerate write select having three inputs, each input coupled to a data signal in the plurality of data signals, and the plurality of read selects further comprising a plurality of nondegenerate read selects, each nondegenerate read select having three inputs, each input coupled to a bit line in the plurality of bit lines;

wherein logical values input on the select bus write portion to each nondegenerate write select in the plurality of nondegenerate write selects are equal to logical values input on the select bus read portion to each corresponding read select in the plurality of nondegenerate read selects.

11. A method for repairing up to two failing bit lines in an array having a plurality of non-spare bit lines, and having a first spare bit line at a first side of the array and a second spare bit line at a second side of the array, the second side of the array being opposite to the first side of the array, the array having a plurality of data signals as inputs, comprising the steps of:

if no failing bit lines exist, using the plurality of non-spare bit lines to store data from the plurality of data signals;

if a first failing bit line in the plurality of non-spare bit lines exists, using the first spare bit line to replace the first failing bit line in the plurality of non-spare bit lines; and if a second failing bit line in the plurality of non-spare bit lines exists, using the second spare bit line to replace the second failing bit line in the plurality of non-spare bit lines.

12. The method of claim 11, further comprising the steps of:

if the first failing bit in the plurality of non-spare bit lines exists, checking whether the first spare bit line is functional;

if the first spare bit line is functional; using the first spare bit line to replace the first failing bit line in the plurality of non-spare bit lines;

if the first spare bit line is non-functional, using the second spare bit line to replace the first failing bit line in the plurality of non-spare bit lines; and if a second bit line in the plurality of non-spare bit lines exists and either the first spare bit line or the second spare bit line is non-functional, rejecting the array.

13. The method of claim 12, further comprising the steps of:

if the first failing bit in the plurality of non-spare bit lines exists and if the first spare bit line is functional, using the first spare bit line to replace the first failing bit line in the plurality of non-spare bit lines; and if the second failing bit line in the plurality of non-spare bit lines exists, checking whether the second spare bit line is functional;

if the second spare bit line is functional, using the second spare bit line to replace the second failing bit line in the plurality of non-spare bit lines; and if the second spare bit line is non-functional, rejecting the array.

14. A method for building an array having a plurality of data signals coupled to the array and a plurality of non-spare bit lines, a number of non-spare bit lines in the plurality of non-spare bit lines equal to the number of data signals in the plurality of data signals, the array capable of having more than one failing bit line repairable; the method comprising the steps of:

supplying a number of spare bit lines, the number of spare bit lines equal to the number of repairable failing bit lines that can be repaired;

identifying failing bit lines in the plurality on non-spare bit lines;

storing identity of each failing bit line in a fail map;

routing each data signal in the plurality of data signals to a functional bit line during a write operation; and routing to each instant data signal in the plurality of data signals data written from the instant data signal during a write operation.

15. The method of claim 14, the step of supplying a number of spare bit lines further comprising the steps of:

supplying more than one spare bit line at a first side of the array;

supplying no spare bit lines at a second side of the array.

16. The method of claim 14, the step of supplying a number of spare bit lines further comprising the steps of:

supplying a first spare bit line at a first side of the array;

supplying a second spare bit line at a second side of the array.

17. The method of claim 16, the step of routing each data signal in the plurality of data signals to a functional bit line during a write operation further comprising the steps of:

if no failing bit lines have been identified, routing each instant data signal to a corresponding non-spare bit line;

if a first failing bit line has been identified, routing a first set of data signals consisting of a first particular data signal corresponding to the first failing bit line, and each of all other data signals between the first particular data signal and the first side of the array to a bit line in a first set of bit lines including the first spare bit line and any remaining bit lines between the first spare bit line and the first failing bit line;

if a second failing bit line has been identified, routing a second set of data signals consisting of a second particular data signal corresponding to the second failing bit line, and each of all other data signals between the second particular data signal and the second side of the array to a bit line in a second set of bit lines including the second spare bit line and any remaining bit lines between the second spare bit line and the second failing bit line.

* * * * *